(12) United States Patent  (10) Patent No.: US 8,134,229 B2
Sasaki et al.  (45) Date of Patent: Mar. 13, 2012

(54) LAYERED CHIP PACKAGE

(75) Inventors: Yoshitaka Sasaki, Milpitas, CA (US); Hiroyuki Ito, Milpitas, CA (US); Tatsuya Harada, Tokyo (JP); Nobuyuki Okuzawa, Tokyo (JP); Satoru Sueki, Tokyo (JP)

(73) Assignees: Headway Technologies, Inc., Milpitas, CA (US); TDK Corporation, Tokyo (JP)

( * ) Notice: Subject to any disclaimer, the term of this patent is extended or adjusted under 35 U.S.C. 154(b) by 0 days.

(21) Appl. No.: 12/923,118

(22) Filed: Sep. 2, 2010

(65) Prior Publication Data

US 2010/0327464 A1  Dec. 30, 2010

Related U.S. Application Data

(62) Division of application No. 12/213,645, filed on Jun. 23, 2008, now Pat. No. 7,846,772.

(51) Int. Cl.
 *H01L 23/02* (2006.01)
(52) U.S. Cl. .......... 257/686; 257/E23.085; 257/E25.027
(58) Field of Classification Search ........... 257/E23.085, 257/E23.173, E25.027
 See application file for complete search history.

(56) References Cited

U.S. PATENT DOCUMENTS

| | | | |
|---|---|---|---|
| 5,571,754 A * | 11/1996 | Bertin et al. ................. | 438/109 |
| 5,648,684 A | 7/1997 | Bertin et al. | |
| 5,656,553 A | 8/1997 | Leas et al. | |
| 5,688,721 A | 11/1997 | Johnson | |
| 5,691,248 A | 11/1997 | Cronin et al. | |
| 5,872,025 A | 2/1999 | Cronin et al. | |
| 5,925,924 A | 7/1999 | Cronin et al. | |
| 5,952,725 A | 9/1999 | Ball | |
| 5,953,588 A | 9/1999 | Camien et al. | |
| 6,355,976 B1 | 3/2002 | Faris | |
| 6,472,746 B2 | 10/2002 | Taniguchi et al. | |
| 6,582,992 B2 | 6/2003 | Poo et al. | |
| 6,706,546 B2 | 3/2004 | Yoshimura et al. | |
| 6,936,913 B2 | 8/2005 | Akerling et al. | |
| 7,064,444 B2 | 6/2006 | Lee et al. | |
| 7,119,428 B2 | 10/2006 | Tanie et al. | |
| 7,127,807 B2 | 10/2006 | Yamaguchi et al. | |
| 7,491,288 B2 | 2/2009 | Furui et al. | |
| 7,572,673 B2 | 8/2009 | Chung et al. | |
| 7,605,457 B2 * | 10/2009 | Hoshino et al. ............... | 257/686 |
| 7,676,912 B2 | 3/2010 | Sasaki et al. | |
| 2002/0096760 A1 | 7/2002 | Simelgor et al. | |
| 2003/0146012 A1 * | 8/2003 | Song et al. ................... | 174/52.1 |
| 2005/0023656 A1 | 2/2005 | Leedy | |
| 2006/0118972 A1 | 6/2006 | Baek et al. | |

(Continued)

OTHER PUBLICATIONS

Mar. 24, 2010 Notice of Allowance issued in U.S. Appl. No. 12/216,144.

(Continued)

*Primary Examiner* — Michael Lebentritt
*Assistant Examiner* — Daniel Whalen
(74) *Attorney, Agent, or Firm* — Oliff & Berridge, PLC

(57) ABSTRACT

A layered chip package includes a main body including a plurality of layer portions, and wiring disposed on a side surface of the main body. Each layer portion includes a semiconductor chip, an insulating portion covering at least one side surface of the semiconductor chip, and a plurality of electrodes connected to the semiconductor chip. The insulating portion has an end face located at the side surface of the main body on which the wiring is disposed. Each electrode has an end face surrounded by the insulating portion and located at the side surface of the main body on which the wiring is disposed.

3 Claims, 24 Drawing Sheets

U.S. PATENT DOCUMENTS

| | | |
|---|---|---|
| 2007/0170573 A1 | 7/2007 | Kuroda et al. |
| 2007/0275505 A1 | 11/2007 | Wolterink et al. |
| 2008/0006921 A1 | 1/2008 | Park et al. |
| 2008/0029868 A1 | 2/2008 | Lee et al. |
| 2008/0083976 A1 | 4/2008 | Haba et al. |
| 2008/0083977 A1 | 4/2008 | Haba et al. |
| 2008/0128882 A1 | 6/2008 | Baek et al. |
| 2008/0230922 A1 | 9/2008 | Mochizuki et al. |
| 2008/0308946 A1 | 12/2008 | Pratt |
| 2009/0001600 A1 | 1/2009 | Somani |
| 2009/0004777 A1 | 1/2009 | Kolan et al. |
| 2009/0051046 A1 | 2/2009 | Yamazaki et al. |
| 2009/0115042 A1 | 5/2009 | Koyanagi |
| 2009/0236031 A1 | 9/2009 | Sunohara et al. |
| 2009/0305502 A1 | 12/2009 | Lee et al. |
| 2009/0321957 A1 | 12/2009 | Sasaki et al. |
| 2009/0325345 A1 | 12/2009 | Sasaki et al. |
| 2010/0140771 A1 | 6/2010 | Huang et al. |
| 2010/0230795 A1 | 9/2010 | Kriman et al. |
| 2010/0240174 A1 | 9/2010 | Yu et al. |

OTHER PUBLICATIONS

Aug. 17, 2009 Office Action issued in U.S. Appl. No. 12/216,144.
May 20, 2010 Office Action issued in U.S. Appl. No. 12/213,645.
Mar. 29, 2010 Restriction Requirement issued in U.S. Appl. No. 12/213,645.
Jun. 25, 2009 Office Action issued in U.S. Appl. No. 12/216,168.
Jan. 11, 2010 Notice of Allowance issued in U.S. Appl. No. 12/216,168.
Gann, "Neo-Stacking Technology," *HDI Mazazine*, Dec. 1999.
U.S. Appl. No. 11/878,282, filed Jul. 23, 2007 (in the name of Yoshitaka Sasaki et al.).
U.S. Appl. No. 11/896,709, filed Sep. 5, 2007 (in the name of Yoshitaka Sasaki et al.).
U.S. Appl. No. 12/213,645, filed Jun. 23, 2008 (in the name of Yoshitaka Sasaki et al.).
U.S. Appl. No. 12/216,144, filed Jun. 30, 2008 (in the name of Yoshitaka Sasaki et al.).
U.S. Appl. No. 12/216,168, filed Jun. 30, 2008 (in the name of Yoshitaka Sasaki et al.).
Dec. 10, 2009 Restriction Requirement issued in U.S. Appl. No. 12/216J43.
Jan. 19, 2010 Restriction Requirement issued in U.S. Appl. No. 12/216,143.
Jun. 1, 2010 Office Action issued in U.S. Appl. No. 12/216,143.
Sep. 20, 2010 Notice of Allowance issued in U.S. Appl. No. 12/216,143.
Oct. 8, 2010 Notice of Allowance issued in U.S. Appl. No. 12/805,446.

* cited by examiner

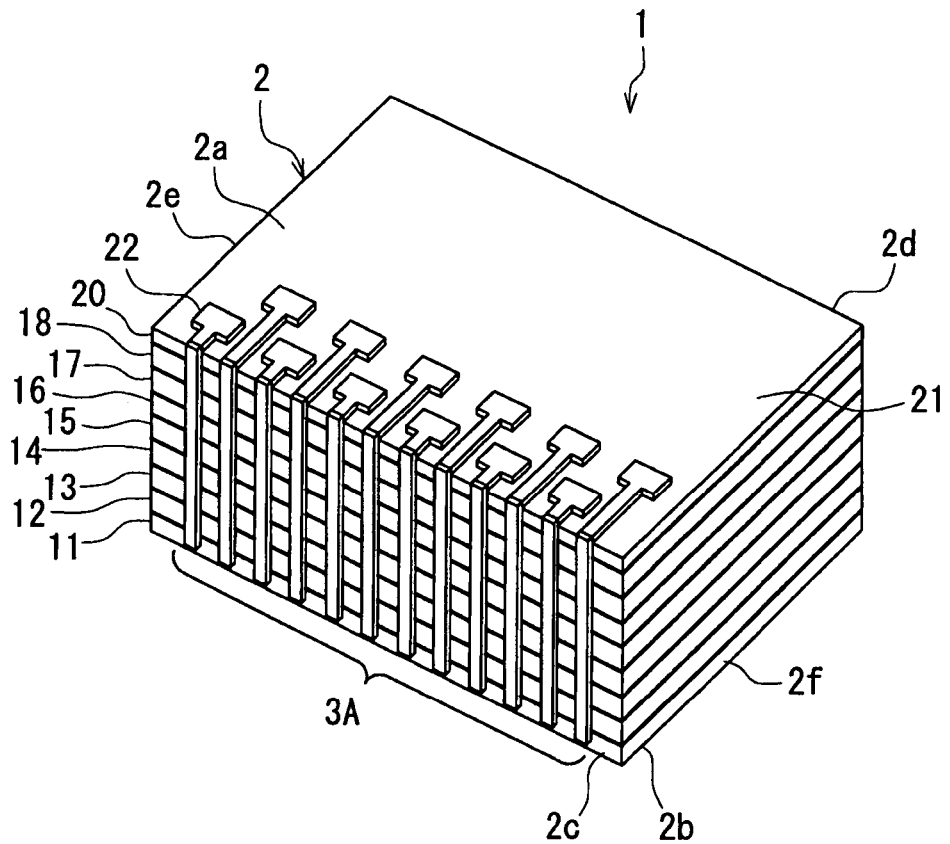
F I G. 35
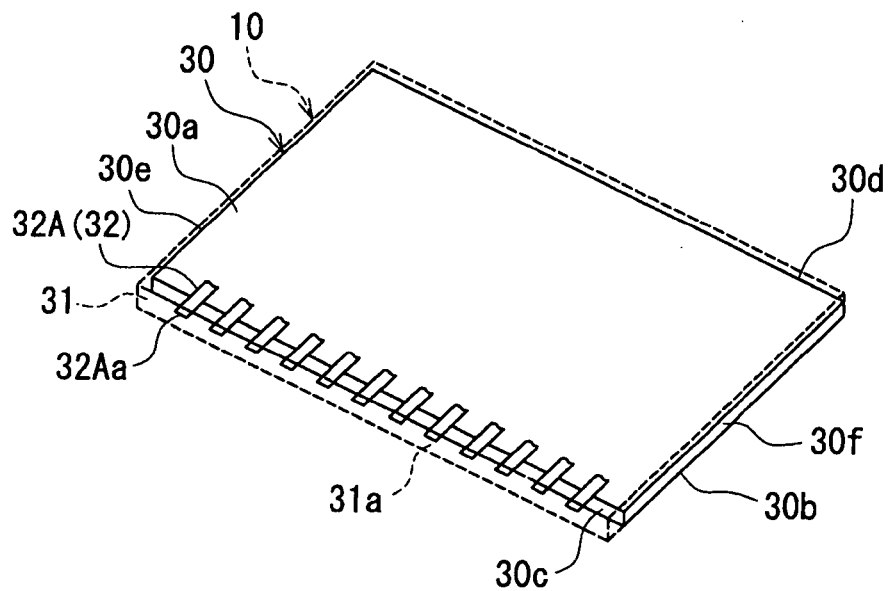
F I G. 36

LAYERED CHIP PACKAGE

This is a Division of application Ser. No. 12/213,645 filed Jun. 23, 2008. The disclosure of the prior application is hereby incorporated by reference herein in its entirety.

BACKGROUND OF THE INVENTION

1. Field of the Invention

The present invention relates to a layered chip package including a plurality of chips stacked and a method of manufacturing the same, and to a layered chip package substructure for use in the manufacture of the layered chip package.

2. Description of the Related Art

In recent years, a reduction in weight and an improvement in performance have been demanded of mobile devices typified by cellular phones and notebook personal computers. Accordingly, there has been a demand for higher integration of electronic components for use in mobile devices. Higher integration of electronic components has been demanded also for achieving an increase in capacity of semiconductor memory.

As an example of highly integrated electronic components, a system-in-package (hereinafter referred to as SiP), especially an SiP utilizing a three-dimensional packaging technology for stacking a plurality of chips, has attracting attention in recent years. In the present application, a package including a plurality of chips stacked is called a layered chip package. Since the layered chip package allows a reduction in wiring length, it provides the advantage of allowing a higher operation speed for a circuit and a reduction in stray capacitance of wiring, as well as the advantage of allowing higher integration.

Major examples of three-dimensional packaging technology for fabricating a layered chip package include a wire bonding method and a through electrode method. According to the wire bonding method, a plurality of chips are stacked on a substrate and wire bonding is performed to connect a plurality of electrodes formed on each chip to external connecting terminals formed on the substrate. According to the through electrode method, a plurality of through electrodes are formed in each of chips to be stacked and inter-chip wiring is performed through the use of the through electrodes.

The wire bonding method has a problem that it is difficult to reduce the distance between the electrodes so as to avoid contact between wires, and a problem that high resistances of the wires hamper a high-speed operation of a circuit.

The through electrode method is free from the above-mentioned problems of the wire bonding method. Unfortunately, however, the through electrode method requires a large number of steps for forming the through electrodes in chips, and consequently increases the cost for the layered chip package. According to the through electrode method, forming the through electrodes in chips requires a series of steps as follows: forming a plurality of holes for the plurality of through electrodes in a wafer that will be cut later to become a plurality of chips; forming an insulating layer and a seed layer in the plurality of holes and on the top surface of the wafer; forming a plurality of through electrodes by filling the plurality of holes with metal such as Cu by plating; and removing unwanted portions of the seed layer.

According to the through electrode method, the through electrodes are formed by filling metal into holes having relatively high aspect ratios. Consequently, voids or keyholes are prone to occur in the through electrodes due to poor filling of the holes with metal, so that the reliability of wiring formed by the through electrodes tends to be reduced.

According to the through electrode method, an upper chip and a lower chip are physically joined to each other by connecting the through electrodes of the upper and lower chips by means of, for example, soldering. The through electrode method therefore requires that the upper and lower chips be accurately aligned and then joined to each other at high temperatures. When the upper and lower chips are joined to each other at high temperatures, however, misalignment between the upper and lower chips can occur due to expansion and contraction of the chips, which often results in electrical connection failure between the upper and lower chips.

The through electrode method has a further problem that, if the plurality of chips stacked include one or more defective chips, it is difficult to replace the defective chip(s) with non-defective one(s). In a layered chip package fabricated by the through electrode method, the respective through electrodes of the upper and lower chips are connected to each other by means of, for example, soldering. To remove a defective chip from the layered chip package, it is therefore necessary to melt solder between the defective chip and another chip by heating. This heating also melts solder between non-defective chips, and can thereby cause oxidation or flowing-out of the solder between the non-defective chips. As a result, electrical connection failure can occur between the non-defective chips. For this reason, according to the through electrode method, it is difficult to replace one or more defective chips, if included in the stack of a plurality of chips, with non-defective one(s). This can result in a reduction in yield and an increase in cost for the layered chip package.

U.S. Pat. No. 5,953,588 discloses a method of manufacturing a layered chip package as described below. In this method, a plurality of chips cut out from a processed wafer are embedded into an embedding resin and then a plurality of leads to be connected to each chip are formed, whereby a structure called a neo-wafer is fabricated. Next, the neo-wafer is diced to form a plurality of structures each called a neo-chip. Each neo-chip includes: one or more chips; resin surrounding the chip(s); and a plurality of leads. The plurality of leads connected to each chip each have an end face exposed at a side surface of the neo-chip. Next, a plurality of kinds of neo-chips are laminated into a stack. In the stack, the respective end faces of the plurality of leads connected to the chips of each layer are exposed at the same side surface of the stack.

Keith D. Gann, "Neo-Stacking Technology", HDI Magazine, December 1999, discloses fabricating a stack by the same method as U.S. Pat. No. 5,953,588, and forming wiring on two side surfaces of the stack.

The manufacturing method disclosed in U.S. Pat. No. 5,953,588 involves a number of process steps and this raises the cost for the layered chip package. According to this method, after the plurality of chips cut out from the processed wafer are embedded into the embedding resin, the plurality of leads to be connected to each chip are formed to fabricate the neo-wafer, as described above. Accurate alignment of the plurality of chips is therefore required when fabricating the neo-wafer. This is also a factor that raises the cost for the layered chip package.

U.S. Pat. No. 7,127,807 B2 discloses a multilayer module formed by stacking a plurality of active layers each including a flexible polymer substrate with at least one electronic element and a plurality of electrically-conductive traces formed within the substrate. According to this multilayer module, however, it is impossible to increase the proportion of the area occupied by the electronic element in each active layer, and consequently it is difficult to achieve higher integration.

OBJECT AND SUMMARY OF THE INVENTION

It is an object of the present invention to provide a layered chip package, a manufacturing method for the same and a layered chip package substructure for use in manufacturing the layered chip package that make it possible to mass-produce the layered chip package including a stack of a plurality of chips at low cost in a short period of time.

A layered chip package manufactured by a manufacturing method of the present invention includes: a main body having a top surface, a bottom surface and four side surfaces; and wiring disposed on at least one of the side surfaces of the main body. The main body includes a plurality of layer portions stacked. Each of the plurality of layer portions includes: a semiconductor chip having a top surface, a bottom surface and four side surfaces; an insulating portion covering at least one of the four side surfaces of the semiconductor chip; and a plurality of electrodes connected to the semiconductor chip. The insulating portion has at least one end face located at the at least one of the side surfaces of the main body on which the wiring is disposed. Each of the plurality of electrodes has an end face that is surrounded by the insulating portion and located at the at least one of the side surfaces of the main body on which the wiring is disposed. The wiring is connected to the end faces of the plurality of electrodes of the plurality of layer portions.

The manufacturing method for the layered chip package of the present invention includes the steps of;

fabricating a plurality of substructures that respectively correspond to the plurality of layer portions of the layered chip package, each substructure including a plurality of its corresponding layer portions and being intended to be cut later at a boundary between every adjacent ones of the plurality of its corresponding layer portions; and completing the layered chip package by fabricating the main body using the plurality of substructures and by forming the wiring on the main body.

The step of fabricating the plurality of substructures includes, as a series of steps for fabricating each substructure, the step of fabricating a pre-substructure wafer by performing processing on a first surface of a semiconductor wafer having the first surface and a second surface that face toward opposite directions, the pre-substructure wafer having a first surface and a second surface that respectively correspond to the first surface and the second surface of the semiconductor wafer and including a plurality of pre-semiconductor-chip portions aligned, each of the pre-semiconductor-chip portions including a device;

the step of forming at least one groove in the pre-substructure wafer, the at least one groove opening at the first surface of the pre-substructure wafer and extending to be adjacent to at least one of the pre-semiconductor-chip portions;

the step of forming an insulating layer to fill the at least one groove, the insulating layer being intended to become part of the insulating portion later; and the step of forming the plurality of electrodes such that part of each of the electrodes lies on the insulating layer.

In the manufacturing method for the layered chip package of the present invention, in the step of completing the layered chip package, the insulating layer is cut to form a cut surface along a direction in which the at least one groove extends, whereby part of the at least one end face of the insulating portion is formed by the cut surface of the insulating layer and the end faces of the plurality of electrodes are exposed.

In the manufacturing method for the layered chip package of the present invention, the step of completing the layered chip package may include the steps of: fabricating a main body aggregate by using the plurality of substructures, the main body aggregate including a plurality of pre-main-body portions each of which will later become the main body, the plurality of pre-main-body portions being aligned in one direction that is orthogonal to the stacking direction of the plurality of layer portions; forming the wiring for each of the pre-main-body portions of the main body aggregate; and cutting the main body aggregate after the formation of the wiring so as to separate the plurality of pre-main-body portions from each other so that each of them becomes the main body and a plurality of layered chip packages are thereby formed.

The step of fabricating the main body aggregate may include the steps of: fabricating a layered substructure by stacking the plurality of substructures in correspondence with the order of stacking of the plurality of layer portions of the layered chip package; and cutting the layered substructure so as to form the main body aggregate. The insulating layer may be cut in the step of cutting the layered substructure. In this case, in the step forming the plurality of electrodes, an alignment mark may be formed on the insulating layer simultaneously with the formation of the plurality of electrodes and, in the step of fabricating the layered substructure, alignment of the plurality of substructures to be stacked may be performed using the alignment mark. The insulating layer may be transparent. In the step of forming the at least one groove in the pre-substructure wafer, the at least one groove may be formed to have a bottom that does not reach the second surface of the pre-substructure wafer, and the step of fabricating the layered substructure may include the step of polishing each of the plurality of substructures from a surface corresponding to the second surface of the pre-substructure wafer until the at least one groove becomes exposed.

The step of fabricating the main body aggregate may include the steps of: forming a plurality of elements by cutting each of the plurality of substructures, the plurality of elements being intended to be stacked later to thereby constitute the main body aggregate; and stacking the plurality of elements so as to form the main body aggregate. The insulating layer may be cut in the step of forming the plurality of elements. In this case, in the step of forming the plurality of electrodes, an alignment mark may be formed on the insulating layer simultaneously with the formation of the plurality of electrodes and, in the step of stacking the plurality of elements, alignment of the plurality of elements to be stacked may be performed using the alignment mark. The insulating layer may be transparent.

In the step of forming the wiring, a plurality of main body aggregates may be arranged in the stacking direction of the plurality of layer portions and then the wiring may be formed for each of the pre-main-body portions of the plurality of main body aggregates. In this case, in the step of forming the plurality of electrodes, an alignment mark may be formed on the insulating layer simultaneously with the formation of the plurality of electrodes and, in the step of forming the wiring, alignment of the plurality of main body aggregates to be arranged in the stacking direction of the plurality of layer portions may be performed using the alignment mark. The insulating layer may be transparent.

In the manufacturing method for the layered chip package of the present invention, only one of the four side surfaces of the semiconductor chip may be covered with the insulating portion while the other three of the four side surfaces of the semiconductor chip may be respectively located at three of the side surfaces of the main body.

In the manufacturing method for the layered chip package of the present invention, of the four side surfaces of the semiconductor chip, two that face toward opposite directions may be covered with the insulating portion while the other two may be respectively located at two of the side surfaces of the main body.

In the manufacturing method for the layered chip package of the present invention, the four side surfaces of the semiconductor chip may be covered with the insulating portion. In addition, in the step of forming the at least one groove in the pre-substructure wafer, a plurality of first grooves and a plurality of second grooves may be formed, wherein the first and second grooves may extend in directions orthogonal to each other.

A first layered chip package of the present invention includes: a main body having a top surface, a bottom surface, first and second side surfaces facing toward opposite directions, and third and fourth side surfaces facing toward opposite directions; and wiring disposed on the first side surface of the main body. The main body includes a plurality of layer portions stacked. Each of the plurality of layer portions includes a semiconductor chip having a top surface, a bottom surface, first and second side surfaces facing toward opposite directions, and third and fourth side surfaces facing toward opposite directions. The second, third and fourth side surfaces of the semiconductor chip are respectively located at the second, third and fourth side surfaces of the main body. The first side surface of the semiconductor chip faces toward the first side surface of the main body. Each of the plurality of layer portions further includes: an insulating portion covering the first side surface of the semiconductor chip; and a plurality of electrodes connected to the semiconductor chip. The insulating portion has an end face located at the first side surface of the main body. Each of the plurality of electrodes has an end face located at the first side surface of the main body and surrounded by the insulating portion. The wiring is connected to the end faces of the plurality of electrodes of the plurality of layer portions.

A second layered chip package of the present invention includes: a main body having a top surface, a bottom surface, first and second side surfaces facing toward opposite directions, and third and fourth side surfaces facing toward opposite directions; first wiring disposed on the first side surface of the main body; and second wiring disposed on the second side surface of the main body. The main body includes a plurality of layer portions stacked. Each of the plurality of layer portions includes a semiconductor chip having a top surface, a bottom surface, first and second side surfaces facing toward opposite directions, and third and fourth side surfaces facing toward opposite directions. The third and fourth side surfaces of the semiconductor chip are respectively located at the third and fourth side surfaces of the main body. The first and second side surfaces of the semiconductor chip respectively face toward the first and second side surfaces of the main body. Each of the plurality of layer portions further includes: an insulating portion covering the first and second side surfaces of the semiconductor chip; and a plurality of first electrodes and a plurality of second electrodes connected to the semiconductor chip. The insulating portion has a first end face located at the first side surface of the main body, and a second end face located at the second side surface of the main body. Each of the plurality of first electrodes has an end face located at the first side surface of the main body and surrounded by the insulating portion. Each of the plurality of second electrodes has an end face located at the second side surface of the main body and surrounded by the insulating portion. The first wiring is connected to the end faces of the plurality of first electrodes of the plurality of layer portions. The second wiring is connected to the end faces of the plurality of second electrodes of the plurality of layer portions.

A layered chip package substructure of the present invention is used for manufacturing a layered chip package, the layered chip package including: a main body having a top surface, a bottom surface and four side surfaces; and wiring disposed on at least one of the side surfaces of the main body. In the layered chip package, the main body includes a plurality of layer portions stacked. Each of the plurality of layer portions includes: a semiconductor chip having a top surface, a bottom surface and four side surfaces; an insulating portion covering at least one of the four side surfaces of the semiconductor chip; and a plurality of electrodes connected to the semiconductor chip. The insulating portion has at least one end face located at the at least one of the side surfaces of the main body on which the wiring is disposed. Each of the plurality of electrodes has an end face that is surrounded by the insulating portion and located at the at least one of the side surfaces of the main body on which the wiring is disposed. The wiring is connected to the end faces of the plurality of electrodes of the plurality of layer portions.

The layered chip package substructure corresponds to one of the plurality of layer portions of the layered chip package, includes a plurality of its corresponding layer portions, and is intended to be cut later at a boundary between every adjacent ones of the plurality of its corresponding layer portions.

The layered chip package substructure of the present invention includes a substructure main body fabricated by performing processing on a first surface of a semiconductor wafer having the first surface and a second surface that face toward opposite directions, the substructure main body including a plurality of pre-semiconductor-chip portions aligned, each of the pre-semiconductor-chip portions including a device. The substructure main body has a first surface and a second surface that respectively correspond to the first surface and the second surface of the semiconductor wafer, and has at least one groove that opens at the first surface of the substructure main body and that extends to be adjacent to at least one of the pre-semiconductor-chip portions. The at least one groove has a bottom that does not reach the second surface of the substructure main body. The layered chip package substructure further includes: an insulating layer that fills the at least one groove and that will later become part of the insulating portion; and the plurality of electrodes each having a portion lying on the insulating layer.

The manufacturing method for the layered chip package, the layered chip package or the layered chip package substructure of the present invention makes it possible to mass-produce layered chip package at low cost in a short period of time.

Other and further objects, features and advantages of the invention will appear more fully from the following description.

BRIEF DESCRIPTION OF THE DRAWINGS

FIG. 35 is a perspective view of a layered chip package of a third embodiment of the invention.

FIG. 36 is a perspective view of one of layer portions included in the layered chip package of the third embodiment of the invention.

DETAILED DESCRIPTION OF THE PREFERRED EMBODIMENTS

[First Embodiment]

Figure 1:
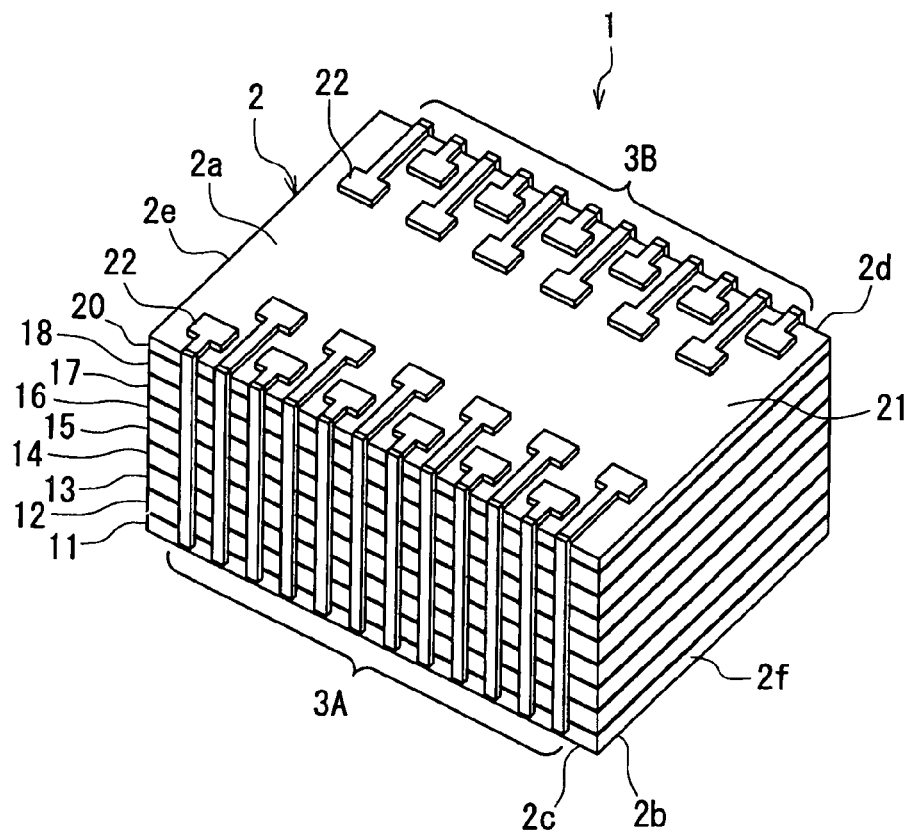
FIG. 1 is a perspective view of a layered chip package of a first embodiment of the invention.

Embodiments of the present invention will now be described in detail with reference to the drawings. Reference is first made to FIG. 1 to describe the configuration of a layered chip package of a first embodiment of the invention. FIG. 1 is a perspective view of the layered chip package of the first embodiment. As shown in FIG. 1, the layered chip package 1 of the first embodiment includes a main body 2 that is rectangular-solid-shaped. The main body 2 has a top surface 2a, a bottom surface 2b, a first side surface 2c and a second side surface 2d facing toward opposite directions, and a third side surface 2e and a fourth side surface 2f facing toward opposite directions.

The layered chip package 1 further includes wiring disposed on at least one of the side surfaces of the main body 2. In the example shown in FIG. 1, the layered chip package 1 includes first wiring 3A disposed on the first side surface 2c of the main body 2, and second wiring 3B disposed on the second side surface 2d of the main body 2.

The main body 2 includes a plurality of layer portions stacked. By way of example, FIG. 1 shows that the main body 2 includes eight layer portions 11, 12, 13, 14, 15, 16, 17 and 18 that are stacked in this order from the bottom. The number of the layer portions to be included in the main body 2 is not limited to eight, and may be any plural number. In the following description, any layer portion is represented by reference numeral 10.

The main body 2 further includes a terminal layer 20 laid on the uppermost layer portion 18. Every vertically adjacent two of the layer portions are bonded to each other with an adhesive, and so are the layer portion 18 and the terminal layer 20 to each other. The layer portions 11 to 18 and the terminal layer 20 each have a top surface, a bottom surface, and four side surfaces. The terminal layer 20 includes a terminal layer main body 21 having a top surface and a bottom surface, and a plurality of pad-shaped terminals 22 disposed on the top surface of the terminal layer main body 21. The plurality of pad-shaped terminals 22 function as external connecting terminals of the layered chip package 1. Some of the pad-shaped terminals 22 each have an end face located at the side surface 2c of the main body 2, and the first wiring 3A is connected to these end faces. Other some of the pad-shaped terminals 22 each have an end face located at the side surface 2d of the main body 2, and the second wiring 3B is connected to these end faces.

Figure 2:
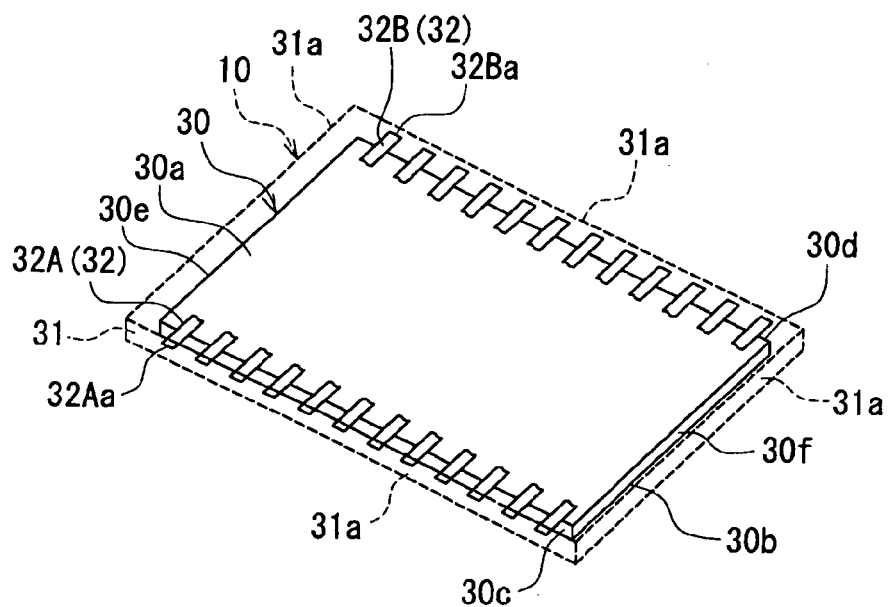
FIG. 2 is a perspective view of one of layer portions included in the layered chip package of FIG. 1.

FIG. 2 is a perspective view of one layer portion 10. As shown in FIG. 2, the layer portion 10 includes a semiconductor chip 30. The semiconductor chip 30 has a top surface 30a, a bottom surface 30b, a first side surface 30c and a second side surface 30d facing toward opposite directions, and a third side surface 30e and a fourth side surface 30f facing toward opposite directions. The side surfaces 30c, 30d, 30e and 30f respectively face toward the side surfaces 2c, 2d, 2e and 2f of the main body 2.

The layer portion 10 further includes: an insulating portion 31 covering at least one of the four side surfaces of the semiconductor chip 30; and a plurality of electrodes 32 connected to the semiconductor chip 30. The insulating portion 31 has at least one end face 31a located at the at least one of the side surfaces of the main body 2 on which the wiring is disposed. In the example shown in FIG. 2, the insulating portion 31 covers all of the four side surfaces of the semiconductor chip 30, and has four end faces 31a that are respectively located at the four side surfaces of the main body 2. In this example, the insulating portion 31 further covers the top surface 30a of the semiconductor chip 30.

In the example shown in FIG. 2, the plurality of electrodes 32 include a plurality of first electrodes 32A and a plurality of second electrodes 32B. Each of the plurality of first electrodes 32A has an end face 32Aa that is located at the first side surface 2c of the main body 2 and surrounded by the insulating portion 31. Each of the plurality of second electrodes 32B has an end face 32Ba that is located at the second side surface 2d of the main body 2 and surrounded by the insulating portion 31. The first wiring 3A disposed on the first side surface 2c of the main body 2 is connected to the end faces 32Aa of the plurality of first electrodes 32A of a plurality of layer portions 10. The second wiring 3B disposed on the second side surface 2d of the main body 2 is connected to the end faces 32Ba of the plurality of second electrodes 32B of the plurality of layer portions 10. In the following description, any electrode is represented by reference numeral 32, and the end face of any electrode 32 is represented by reference numeral 32a.

The semiconductor chip 30 may be a memory chip constituting a memory such as a flash memory, DRAM, SRAM, MRAM, PROM or FeRAM. In this case, a large-capacity memory is provided by the layered chip package 1 including a plurality of semiconductor chips 30. Furthermore, according to the layered chip package 1 of the present embodiment, it is possible to easily provide memory of various capacities such as 64 GB (gigabytes), 128 GB and 256 GB by changing the number of the semiconductor chips 30 included in the layered chip package 1.

The layered chip package 1 may include a plurality of semiconductor chips 30 serving as memory chips that constitute different types of memory. The layered chip package 1 may include a semiconductor chip 30 serving as a memory chip, and another semiconductor chip 30 serving as a controller for controlling the memory chip.

The semiconductor chips 30 are not limited to memory chips, and may provide other devices such as CPUs, sensors, and driving circuits for sensors. The layered chip package 1 of the present embodiment is particularly suitable for providing an SiP.

To facilitate the manufacture of the layered chip package 1 by a manufacturing method described later, it is preferable that the number of the layer portions to be included in the main body 2 be an even number. If the yield of the semiconductor chips 30 is high, the number of the layer portions to be included in the main body 2 may be as large as, for example, eight or sixteen, because there is a low possibility that reworking (remaking) of the layered chip package 1 will be required due to the presence of defective semiconductor chips 30 in the layered chip package 1. On the other hand, if the yield of the semiconductor chips 30 is low, it is preferred that the number of the layer portions to be included in the main body 2 be as small as, for example, two or four, so as to facilitate reworking of the layered chip package 1.

The manufacturing method for the layered chip package 1 of the present embodiment will now be described. The manufacturing method for the layered chip package 1 of the present embodiment includes the steps of: fabricating a plurality of substructures that respectively correspond to the plurality of layer portions 10 of the layered chip package 1, each substructure including a plurality of its corresponding layer portions 10 and being intended to be cut later at a boundary between every adjacent ones of the plurality of its corresponding layer portions 10; and completing the layered chip package 1 by fabricating the main body 2 using the plurality of substructures and by forming the wiring 3A, 3B on the main body 2. The plurality of substructures may each include a plurality of layer portions 10 of the same kind.

With reference to FIG. 3 to FIG. 6, FIG. 11 and FIG. 12, a detailed description will now be made on the step of fabricating the plurality of substructures in the manufacturing method for the layered chip package 1 of the present embodiment. While the following describes a series of steps for fabricating a single substructure, the plurality of substructures are each fabricated by the following series of steps.

Figure 3:
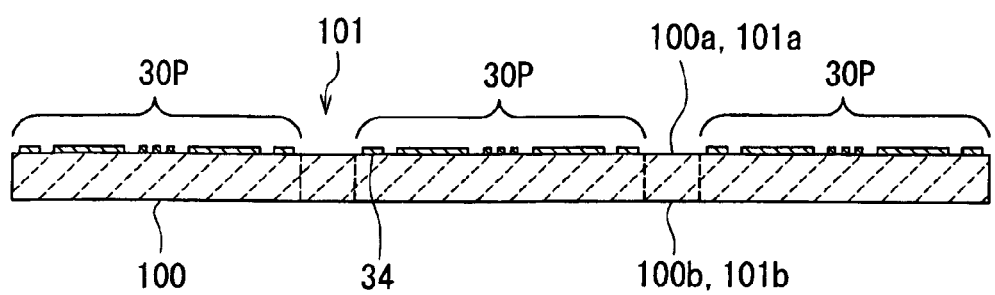
FIG. 3 is a cross-sectional view of a portion of a pre-substructure wafer fabricated in a step of a manufacturing method for the layered chip package of the first embodiment of the invention.

FIG. 3 shows a first step of the series of steps for fabricating each substructure. In this step, a semiconductor wafer 100 having a first surface 100a and a second surface 100b that face toward opposite directions is subjected to processing, such as a wafer process, at the first surface 100a, to thereby fabricate a pre-substructure wafer 101 that includes a plurality of pre-semiconductor-chip portions 30P aligned. The plurality of pre-semiconductor-chip portions 30P each include a device, and are to become the plurality of semiconductor chips 30 later. The plurality of pre-semiconductor-chip portions 30P of the pre-substructure wafer 101 may later become a plurality of the same kind of semiconductor chips 30. The pre-substructure wafer 101 has a first surface 101a corresponding to the first surface 100a of the semiconductor wafer 100, and a second surface 101b corresponding to the second surface 100b of the semiconductor wafer 100. In the pre-substructure wafer 101, the plurality of pre-semiconductor-chip portions 30P may be aligned in a row, or may be aligned in a plurality of rows such that a plurality of ones of the pre-semiconductor-chip portions 30P are aligned in each of vertical and horizontal directions. In the following description, it is assumed that the plurality of pre-semiconductor-chip portions 30P are aligned in a plurality of rows such that a plurality of ones of the pre-semiconductor-chip portions 30P are aligned in each of vertical and horizontal directions in the pre-substructure wafer 101.

The semiconductor wafer 100 may be a silicon wafer, for example. The wafer process is a process in which a wafer is processed into a plurality of devices that are not yet separated into a plurality of chips. In the pre-substructure wafer 101, the first surface 101a is a device formation surface on which devices are formed. Each of the plurality of pre-semiconductor-chip portions 30P has a plurality of pad-shaped electrodes 34 disposed on the first surface 101a of the pre-substructure wafer 101.

Figure 9:
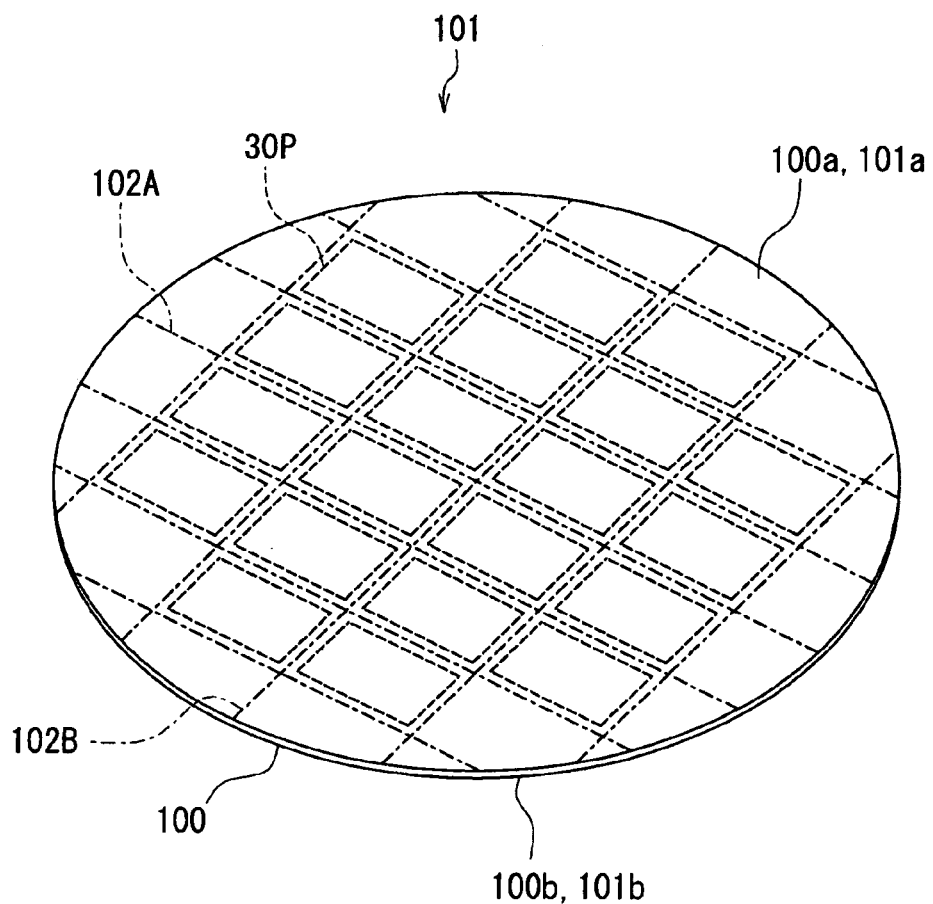
FIG. 9 is a perspective view of the pre-substructure wafer fabricated in the step of FIG. 3.

FIG. 9 is a perspective view of the pre-substructure wafer 101. As shown in FIG. 9, the pre-substructure wafer 101 is provided with a plurality of scribe lines 102A and a plurality of scribe lines 102B. The scribe lines 102A extend horizontally to pass through boundaries between every two pre-semiconductor-chip portions 30P that are vertically adjacent to each other. The scribe lines 102B extend vertically to pass through boundaries between every two pre-semiconductor-chip portions 30P that are horizontally adjacent to each other.

Figure 10:
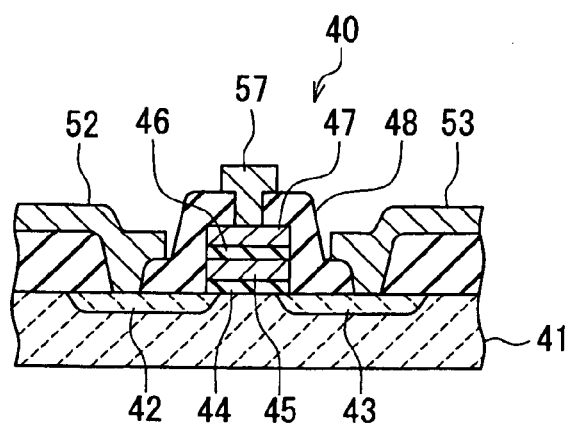
FIG. 10 is a cross-sectional view illustrating an example of the internal structure of a pre-semiconductor-chip portion of the pre-substructure wafer of FIG. 9.

FIG. 10 is a cross-sectional view illustrating an example of the internal structure of each pre-semiconductor-chip portion 30P of the pre-substructure wafer 101 of FIG. 9. Here is given an example in which a plurality of memory cells of a flash memory are formed as a device in the pre-semiconductor-chip portion 30P. FIG. 10 shows one of the plurality of memory cells as a device formed in the pre-semiconductor-chip portion 30P. The memory cell 40 includes a source 42 and a drain 43 formed near a surface of a P-type silicon substrate 41 composed of the semiconductor wafer 100, i.e., near the first surface 100a of the semiconductor wafer 100. The source 42 and the drain 43 are both N-type regions. The source 42 and the drain 43 are disposed at a predetermined distance from each other so that a channel composed of a portion of the P-type silicon substrate 41 is provided between the source 42 and the drain 43. The memory cell 40 further includes an insulating film 44, a floating gate 45, an insulating film 46 and a control gate 47 that are stacked in this order on the surface of the substrate 41 at the location between the source 42 and the drain 43. The memory cell 40 further includes an insulating layer 48 covering the source 42, the drain 43, the insulating film 44, the floating gate 45, the insulating film 46 and the control gate 47. The insulating layer 48 has contact holes that open at the tops of the source 42, the drain 43 and the control gate 47, respectively. The memory cell 40 includes a source electrode 52, a drain electrode 53, and a control gate electrode 57 that are formed on the insulating layer 48 at locations above the source 42, the drain 43 and the control gate 47, respectively. The source electrode 52, the drain electrode 53 and the control gate electrode 57 are connected to the source 42, the drain 43 and the control gate 47, respectively, through the respective contact holes.

Figure 4:
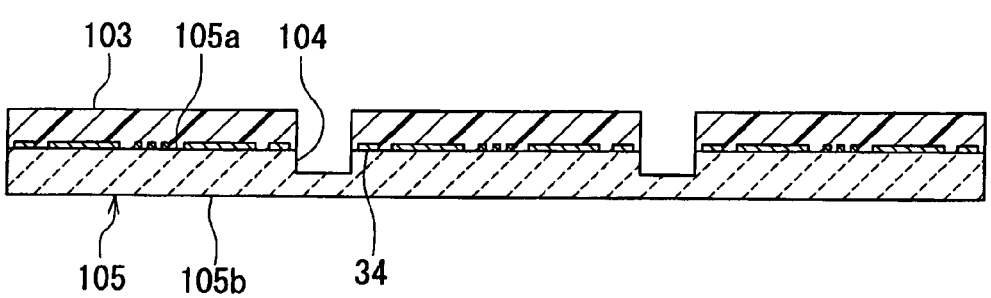
FIG. 4 is a cross-sectional view of a portion of a substructure main body fabricated in a step that follows the step of FIG. 3.

FIG. 4 shows a step that follows the step of FIG. 3. In this step, first, a protection film 103 made of, for example, photoresist, is formed to cover the entire first surface 101a of the pre-substructure wafer 101. Next, at least one groove 104 is formed in the pre-substructure wafer 101. The at least one groove 104 opens at the first surface 101a of the pre-substructure wafer 101 and extends to be adjacent to at least one of the pre-semiconductor-chip portions 30P. Here, a plurality of grooves 104 are formed as shown in FIG. 4. At the positions of the boundaries between every two adjacent pre-semiconductor-chip portions 30P, the grooves 104 are formed to pass through the boundaries between every two adjacent pre-semiconductor-chip portions 30P. In this way, a substructure main body 105 is formed by the pre-substructure wafer 101 having undergone the formation of the plurality of grooves 104 therein. The substructure main body 105 includes the plurality of pre-semiconductor-chip portions 30P. The substructure main body 105 has a first surface 105a and a second surface 105b. The first surface 105a corresponds to the first surface 100a of the semiconductor wafer 100 and the first surface 101a of the pre-substructure wafer 101. The second surface 105b corresponds to the second surface 100b of the semiconductor wafer 100 and the second surface 101b of the pre-substructure wafer 101. The substructure main body 105 further has the plurality of grooves 104 that open at the first surface 105a. In the substructure main body 105, the first surface 105a is a device formation surface on which devices are formed.

The plurality of grooves 104 are formed along the scribe lines 102A and 102B shown in FIG. 9. The grooves 104 are formed such that their bottoms do not reach the second surface 101b of the pre-substructure wafer 101.

The grooves 104 are each 50 to 150 μm wide, for example. The grooves 104 are each 30 to 150 μm deep, for example. The grooves 104 may be formed using a dicing saw, or by etching such as reactive ion etching. If the grooves 104 are to be formed with a jig bonded to the second surface 101b of the pre-substructure wafer 101, the grooves 104 may be formed such that their bottoms reach the second surface 101b.

Figure 11:
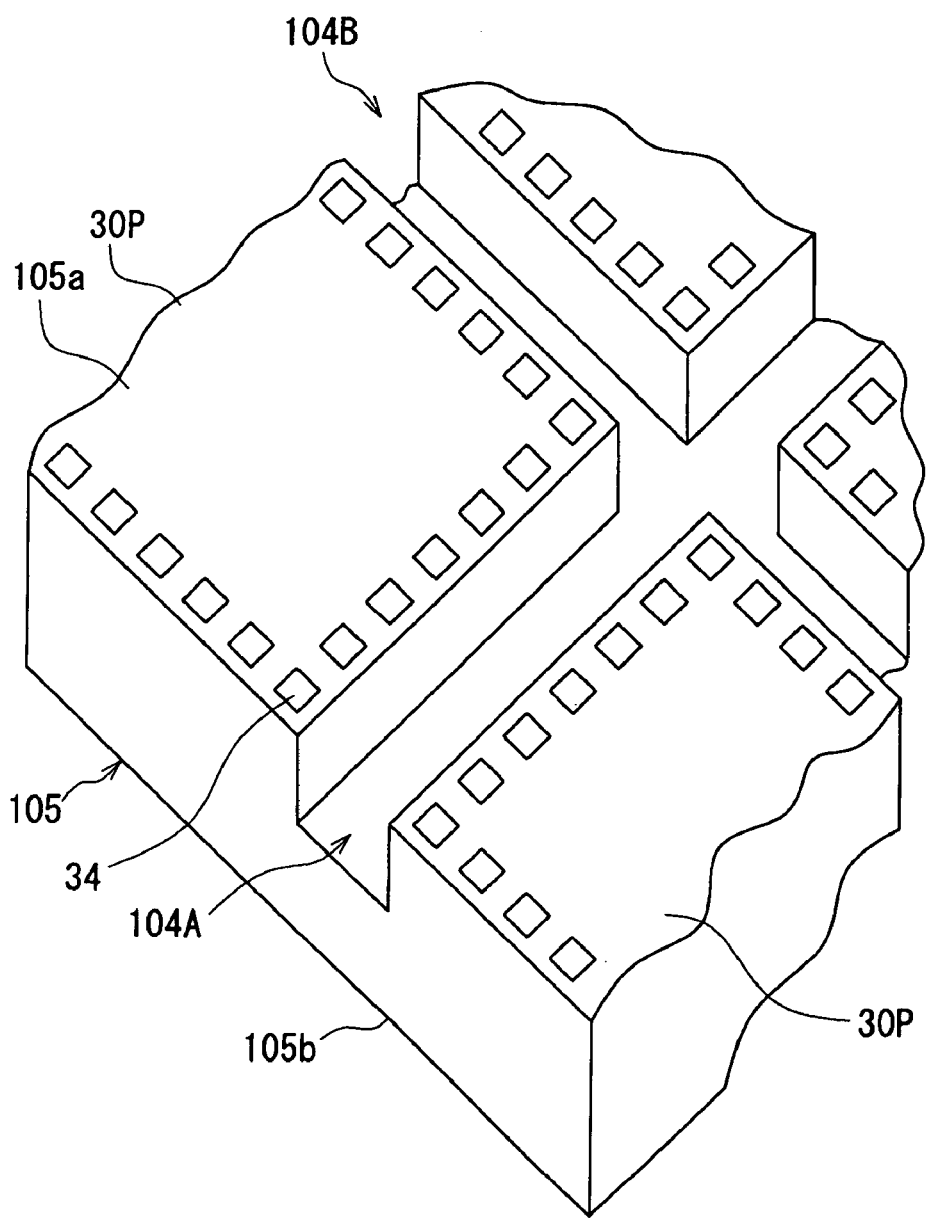
FIG. 11 is a perspective view of a portion of the substructure main body fabricated in the step of FIG. 4.

FIG. 11 shows a portion of the substructure main body 105 fabricated in the step of FIG. 4. In the present embodiment, the plurality of grooves 104 include a plurality of first grooves 104A and a plurality of second grooves 104B. The first grooves 104A and the second grooves 104B extend in directions orthogonal to each other. FIG. 11 shows only one each of the first and second grooves 104A and 104B. The first grooves 104A are formed along the scribe lines 102A shown in FIG. 9, and the second grooves 104B are formed along the scribe lines 102B shown in FIG. 9.

Figure 5:
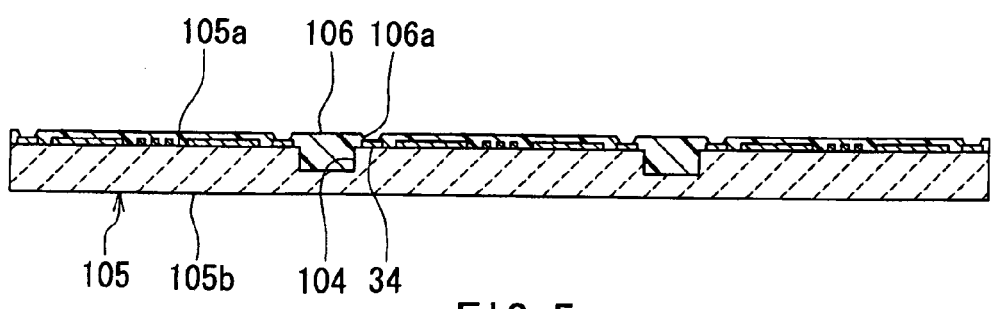
FIG. 5 is a cross-sectional view of a portion of a structure fabricated in a step that follows the step of FIG. 4.

FIG. 5 shows a step that follows the step of FIG. 4. In this step, first, an insulating layer 106 is formed to fill the plurality of grooves 104 of the substructure main body 105 and to cover the plurality of pad-shaped electrodes 34. The insulating layer 106 will later become part of the insulating portion 31. Next, a plurality of openings 106a for exposing the pad-shaped electrodes 34 are formed in the insulating layer 106.

The insulating layer 106 may be formed of a resin such as an epoxy resin or a polyimide resin. The insulating layer 106 may also be formed of a photosensitive material such as a polyimide resin containing a sensitizer. If the insulating layer 106 is formed of a photosensitive material, the openings 106a of the insulating layer 106 may be formed by photolithography. If the insulating layer 106 is formed of a non-photosensitive material, the openings 106a of the insulating layer 106 may be formed by selectively etching the insulating layer 106.

The insulating layer 106 may include a first layer that fills the grooves 104, and a second layer that covers the first layer and the pad-shaped electrodes 34. In this case, the openings 106a are formed in the second layer. Both of the first layer and the second layer may be formed of a resin such as an epoxy resin or a polyimide resin. The second layer may be formed of a photosensitive material such as a polyimide resin containing a sensitizer. If the second layer is formed of a photosensitive material, the openings 106a may be formed in the second layer by photolithography. If the second layer is formed of a non-photosensitive material, the openings 106a may be formed in the second layer by selectively etching the second layer.

It is preferable that the insulating layer 106 be formed of a resin having a low thermal expansion coefficient. Forming the insulating layer 106 of a resin having a low thermal expansion coefficient serves to facilitate cutting of the insulating layer 106 when the insulating layer 106 is cut later with a dicing saw.

It is preferable that the insulating layer 106 be transparent. If the insulating layer 106 is transparent, it is possible to easily recognize alignment marks that will be formed on the insulating layer 106 later, through the insulating layer 106.

Figure 6:
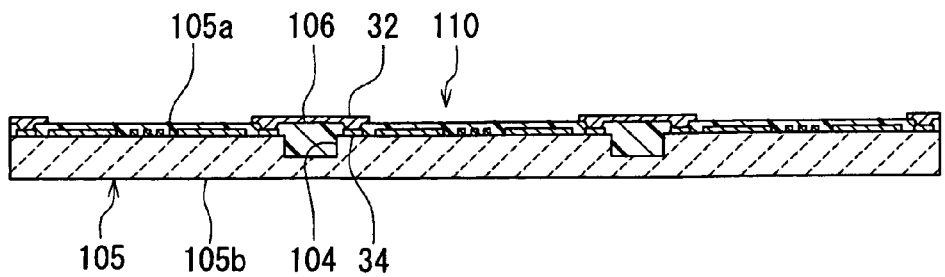
FIG. 6 is a cross-sectional view of a portion of a substructure fabricated in a step that follows the step of FIG. 5.
Figure 12:
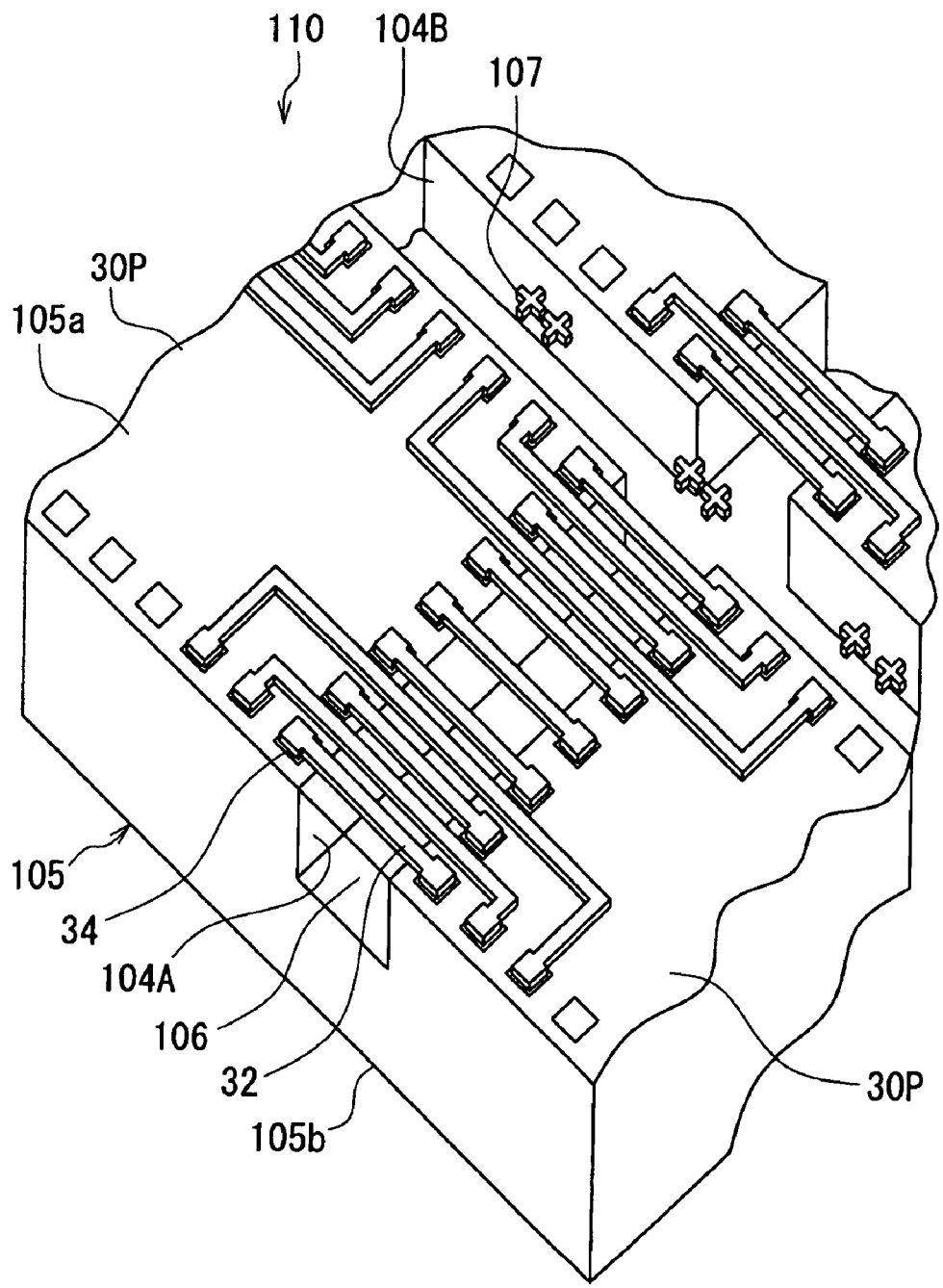
FIG. 12 is a perspective view of a portion of the structure fabricated in the step of FIG. 6.

FIG. 6 shows a step that follows the step of FIG. 5. In this step, the plurality of electrodes 32 are formed such that part of each of the electrodes 32 lies on the insulating layer 106. The electrodes 32 are connected to the pad-shaped electrodes 34 through the openings 106a. FIG. 12 shows a portion of the structure fabricated in the step of FIG. 6. FIG. 6 and FIG. 12 show an example in which electrodes 32 extending from one of two adjacent pre-semiconductor-chip portions 30P are coupled to those extending from the other of the two adjacent pre-semiconductor-chip portions 30P. However, it is not necessarily required that electrodes 32 extending from one of two adjacent pre-semiconductor-chip portions 30P be coupled to those extending from the other of the two adjacent pre-semiconductor-chip portions 30P.

The electrodes 32 are formed of a conductive material such as Cu. The electrodes 32 are formed by frame plating, for example. In this case, first, a seed layer for plating is formed on the insulating layer 106. Next, a frame having grooves is formed on the seed layer. The frame is formed by patterning a photoresist layer by photolithography, for example. Next, plating layers to become part of the electrodes 32 are formed by plating on the seed layer in the grooves of the frame. Next, the frame is removed and the seed layer except portions thereof located below the plating layers is also removed. As a result, the electrodes 32 are formed of the plating layers and the portions of the seed layer remaining therebelow.

As shown in FIG. 12, in the step of forming the plurality of electrodes 32, a plurality of alignment marks 107 are formed on the insulating layer 106 simultaneously with the formation of the plurality of electrodes 32. The alignment marks 107 are disposed above the grooves 104. The material and forming method of the alignment marks 107 are the same as those of the electrodes 32.

The substructure 110 shown in FIG. 6 and FIG. 12 is fabricated by the series of steps described so far. The substructure 110 includes: the substructure main body 105; the insulating layer 106 that fills the grooves 104 of the substructure main body 105 and that will later become part of the insulating portion 31; the plurality of electrodes 32 each having a portion lying on the insulating layer 106; and the plurality of alignment marks 107 disposed on the insulating layer 106. The substructure 110 corresponds to the layered chip package substructure of the present invention.

The following is a description of a series of steps for completing the layered chip package 1 by fabricating the main body 2 using a plurality of substructures 110 that respectively correspond to the plurality of layer portions 10 of the layered chip package 1 and by forming the wiring 3A, 3B on the main body 2.

In the series of steps for completing the layered chip package 1, first, each of the plurality of substructures 110 are polished from a surface corresponding to the second surface 101b of the pre-substructure wafer 101, i.e., from the second surface 105b of the substructure main body 105, until the plurality of grooves 104 become exposed. It is thereby possible to reduce the thickness of each substructure 110.

Figure 7:
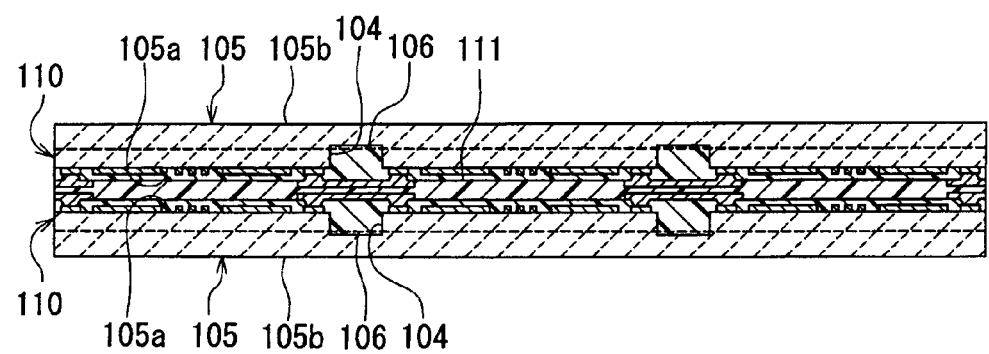
FIG. 7 is a cross-sectional view of a portion of a stack of layers fabricated in a step that follows the step of FIG. 6.

If each substructure 110 is polished alone, the substructure 110 becomes difficult to handle and also becomes susceptible to damage, because of the reduction in thickness of the substructure 110. To cope with this, as shown in FIG. 7, before polishing each substructure 110, a stack including two substructures 110 is formed by bonding the two substructures 110 to each other with an insulating adhesive such that the first surfaces 105a of the respective substructure main bodies 105 face toward each other. Next, both surfaces of this stack, that is, the two second surfaces 105b, are polished to thereby perform the polishing on the two substructures 110. This method facilitates handling of the substructures 110 and makes the substructures 110 resistant to damage, because the strength of the stack of two substructures 110 is greater than that of a single substructure 110. The two substructures 110 to be bonded to each other are those corresponding to two of the layer portions 10 that are vertically adjacent to each other in the layered chip package 1. Between the two substructures 110 bonded, an insulating layer 111 is formed by the adhesive. The insulating layer 111 covers the electrodes 32 and will become part of the insulating portion 31. It is preferable that the insulating layer 111 be transparent. In FIG. 7 the broken lines indicate the positions of the second surfaces 105b of the substructure main bodies 105 after the polishing.

Figure 8:
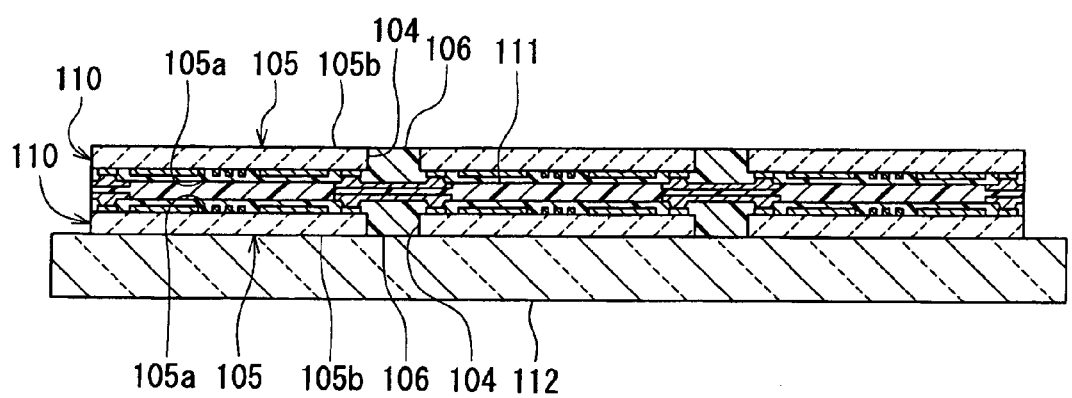
FIG. 8 is a cross-sectional view of a portion of a stack of layers fabricated in a step that follows the step of FIG. 7.

FIG. 8 shows the stack having undergone the polishing of both surfaces as described above. In the step of polishing both surfaces of the stack including the two substructures 110 as described above, after one of the two surfaces of the stack is polished, a plate-shaped jig 112 shown in FIG. 8 is bonded to the polished surface and then the other surface is polished. Bonding the jig 112 to the polished surface of the stack facilitates handling of the stack and prevents the stack from being damaged in a subsequent step. If the insulating layers 106 and 111 are transparent, using a transparent jig such as an acrylic plate or a glass plate as the jig 112 allows the alignment marks 107 of the two substructures 110 included in the stack to be visible through the jig 112 and the insulating layers 106 and 111, all of which are transparent. As a result, as will be described later, when two or more of the stacks of FIG. 8 are stacked on each other, it is possible to perform alignment of the stacks through the use of the alignment marks 107.

Figure 13:
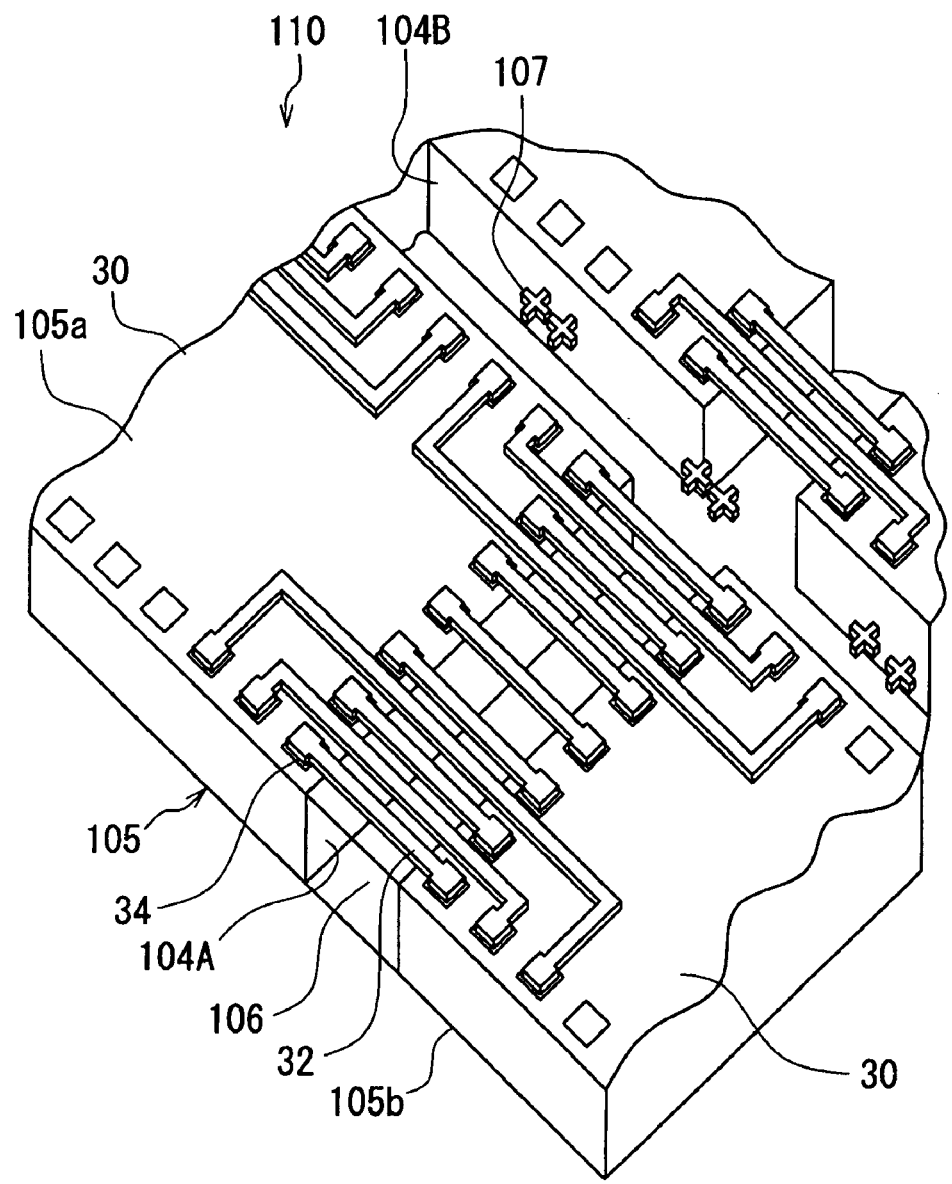
FIG. 13 is a perspective view of a portion of the stack of layers fabricated in the step of FIG. 8.

FIG. 13 shows a portion of the stack fabricated in the step of FIG. 8. By polishing each substructure 110 from the second surface 105b until the grooves 104 become exposed, the plurality of pre-semiconductor-chip portions 30P are separated from each other and thereby become the semiconductor chips 30.

Figure 14:
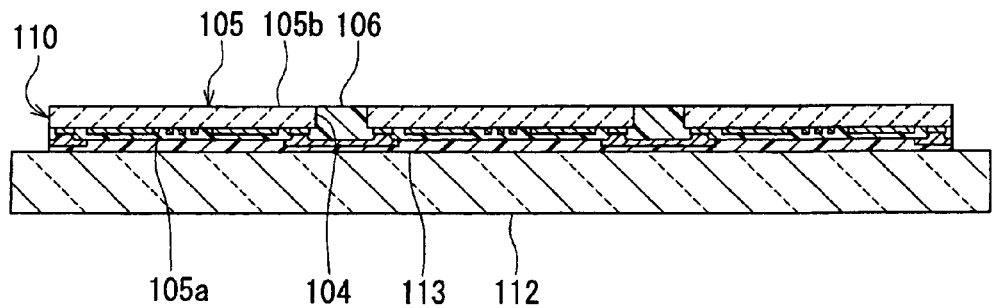
FIG. 14 is a cross-sectional view of a portion of a structure fabricated in another example of the step that follows the step of FIG. 6.
Figure 15:
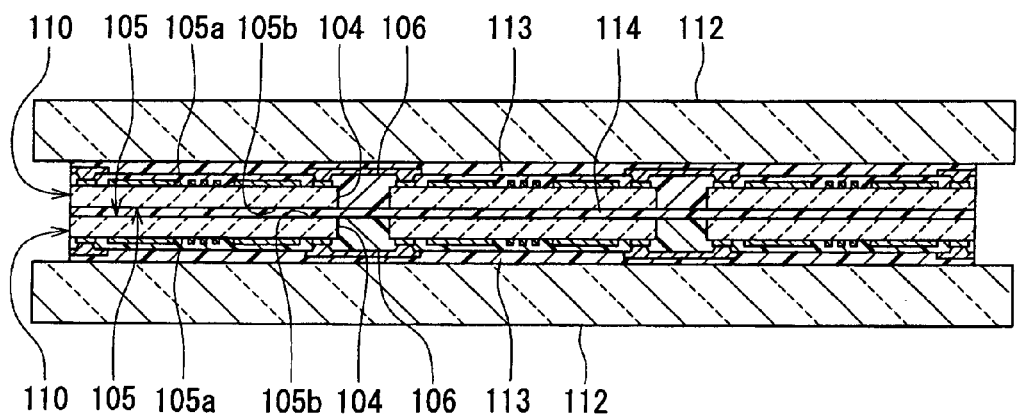
FIG. 15 is a cross-sectional view of a portion of a stack of layers fabricated in a step that follows the step of FIG. 14.

Reference is now made to FIG. 14 and FIG. 15 to describe another method of fabricating a stack including two substructures 110 with the respective second surfaces 105b polished. In this method, first, the substructure 110 shown in FIG. 6 is bonded to a plate-shaped jig 112 shown in FIG. 14 with an insulating adhesive such that the first surface 105a faces one of the surfaces of the jig 112. An insulating layer 113 formed of the adhesive covers the electrodes 32 and will become part of the insulating portion 31. It is preferable that the insulating layer 113 be transparent. Next, the substructure 110 bonded to the jig 112 is polished from a surface corresponding to the second surface 101b of the pre-substructure wafer 101, i.e., from the second surface 105b of the substructure main body 105, until the plurality of grooves 104 become exposed. FIG. 14 shows the substructure 110 and the jig 112 after the polishing.

Next, as shown in FIG. 15, two substructures 110 each having undergone the polishing in the state of being bonded to the jig 112 in the above-described manner are bonded to each other with an insulating adhesive such that the respective second surfaces 105b face toward each other, whereby a stack including the two substructures 110 whose second surfaces 105b have been polished is fabricated. The two substructures 110 to be bonded to each other are those corresponding to two of the layer portions 10 that are vertically adjacent to each other in the layered chip package 1. Between the two substructures 110 bonded, an adhesive layer 114 is formed by the adhesive. It is preferable that the adhesive layer 114 be transparent.

If the insulating layers 106 and 113 and the adhesive layer 114 are transparent, using a transparent jig such as an acrylic plate or a glass plate as the jig 112 makes it possible that the alignment marks 107 of the two substructures 110 to be bonded are visible through the jig 112, the insulating layers 106 and 113 and the adhesive layer 114, all of which are transparent. As a result, it is possible, through the use of the alignment marks 107, to perform alignment of the two substructures 110 to be bonded.

Figure 16:
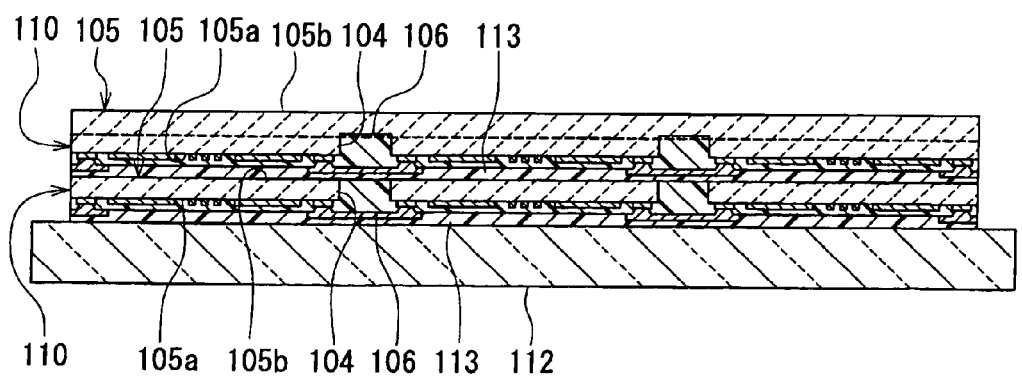
FIG. 16 is a cross-sectional view of a portion of a stack of layers fabricated in still another example of the step that follows the step of FIG. 6.
Figure 17:
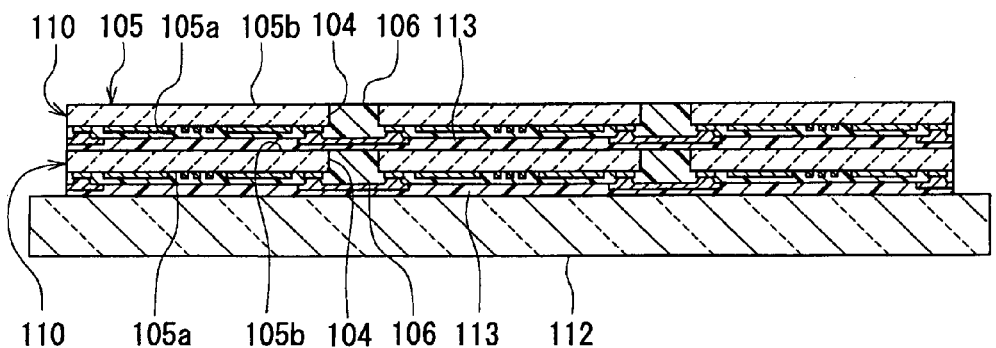
FIG. 17 is a cross-sectional view of a portion of a stack of layers fabricated in a step that follows the step of FIG. 16.

Reference is now made to FIG. 16 and FIG. 17 to describe still another method of fabricating a stack including two substructures 110 with the respective second surfaces 105b polished. In this method, first, the substructure 110 shown in FIG. 6 is bonded to a plate-shaped jig 112 shown in FIG. 16 with an insulating adhesive such that the first surface 105a faces one of the surfaces of the jig 112. This substructure 110 will be called a first substructure 110. An insulating layer 113 formed of the adhesive covers the electrodes 32 and will become part of the insulating portion 31. It is preferable that the insulating layer 113 be transparent. Next, the first substructure 110 bonded to the jig 112 is polished from a surface corresponding to the second surface 101b of the pre-substructure wafer 101, i.e., from the second surface 105b of the substructure main body 105, until the plurality of grooves 104 become exposed.

Next, as shown in FIG. 16, a second substructure 110 other than the first substructure 110 is bonded to the first substructure 110 with an insulating adhesive such that the first surface 105a of the second substructure 110 faces toward the second surface 105b of the first substructure 110 having been polished. The insulating layer 113 formed of the adhesive between the two substructures 110 covers the electrodes 32 of the second substructure 110 and will become part of the insulating portion 31. It is preferable that the insulating layer 113 be transparent. Next, the second substructure 110 is polished from a surface corresponding to the second surface 101b of the pre-substructure wafer 101, i.e., from the second surface 105b of the substructure main body 105, until the plurality of grooves 104 become exposed. In FIG. 16 the broken line indicates the position of the second surface 105b of the second substructure 110 after the polishing. FIG. 17 shows the stack after completion of the polishing of the second substructure 110.

Here, if the insulating layers 106 and 113 are transparent, using a transparent jig such as an acrylic plate or a glass plate as the jig 112 makes it possible that the alignment marks 107 of the two substructures 110 to be bonded are visible from the outside of the jig 112 when the second substructure 110 is bonded to the first substructure 110. As a result, it is possible, through the use of the alignment marks 107, to perform alignment of the two substructures 110 to be bonded.

According to the method shown in FIG. 16 and FIG. 17, it is also possible to stack one or more substructures 110 on the second substructure 110 to thereby fabricate a stack including three or more substructures 110 with the respective second surfaces 105b polished.

A description will now be made on a step subsequent to the polishing of the substructures 110. In this step, the plurality of substructures 110 having undergone the polishing are stacked in correspondence with the order of stacking of the plurality of layer portions 10 of the layered chip package 1 to thereby fabricate a layered substructure. If the layered chip package 1 is to include only two layer portions 10, the stack of two substructures 110 shown in FIG. 8, FIG. 15 or FIG. 17 functions as the layered substructure. If the layered chip package 1 is to include three or more layer portions 10, three or more substructures 110 are stacked to fabricate the layered substructure.

Figure 18:
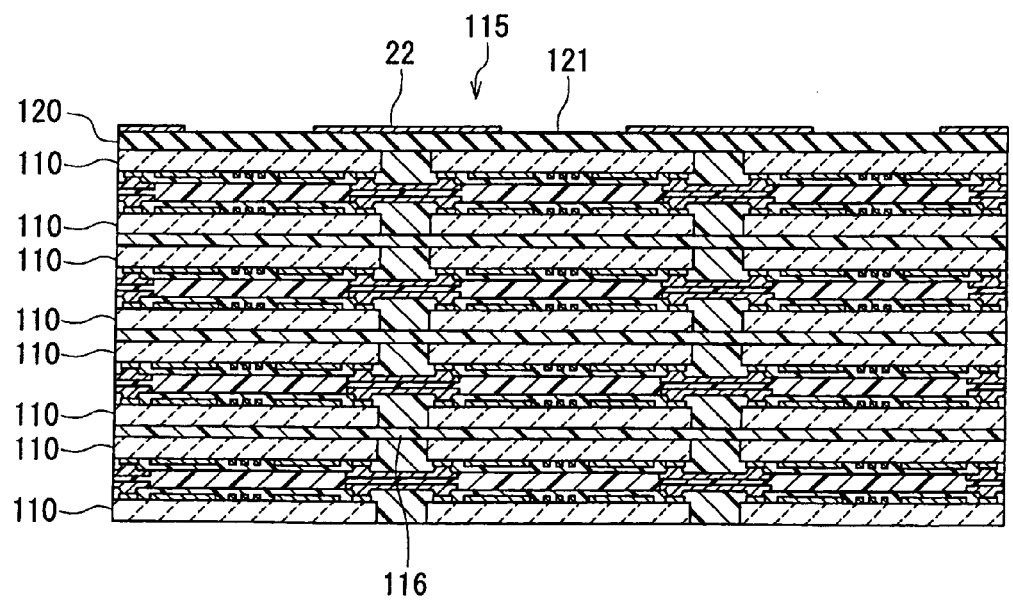
FIG. 18 is a cross-sectional view of a portion of a layered substructure fabricated in a step that follows the step of FIG. 8.
Figure 19:
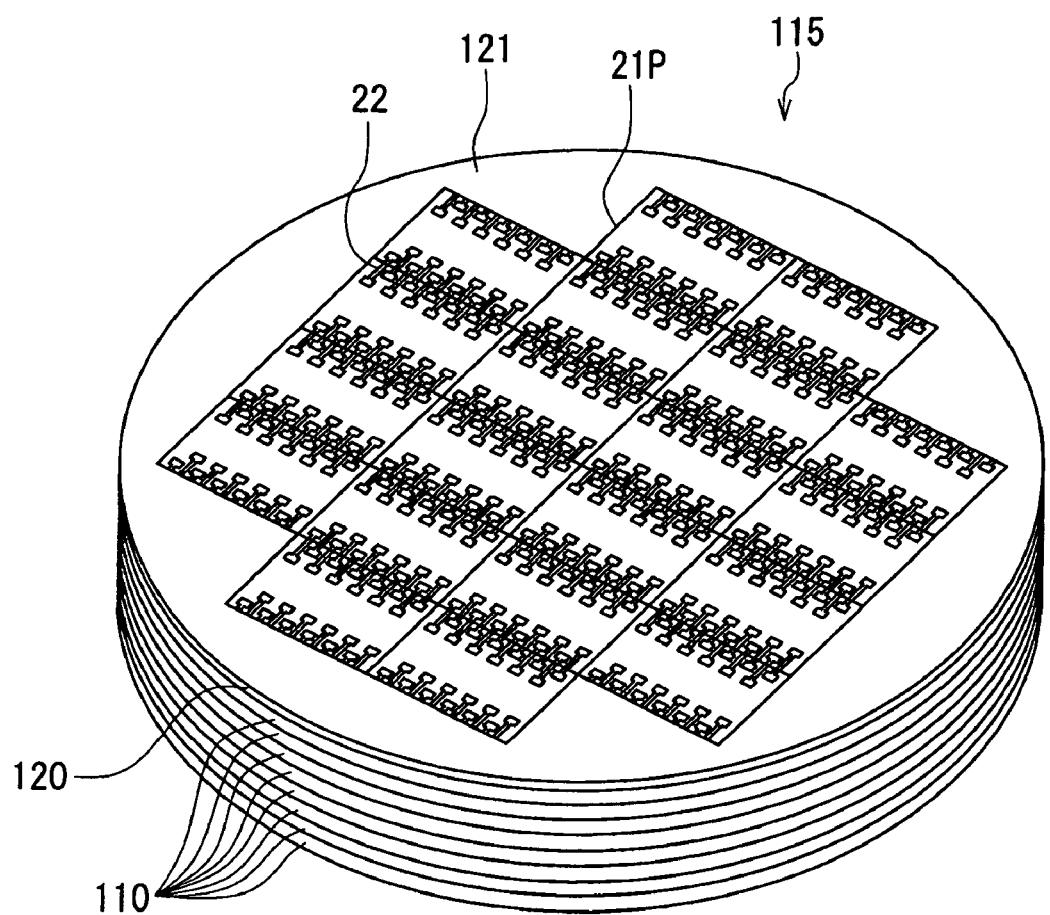
FIG. 19 is a perspective view of the layered substructure fabricated in the step that follows the step of FIG. 8.

Here, a description will be made with reference to an example in which the layered chip package 1 includes eight layer portions 10 and the terminal layer 20, as shown in FIG. 1. FIG. 18 and FIG. 19 show a layered substructure 115 including eight substructures 110 stacked. FIG. 18 and FIG. 19 show an example in which a stack of the eight substructures 110 is obtained by stacking four stacks each of which is shown in FIG. 8 and includes two substructures 110, and then bonding every vertically adjacent two of the four stacks to each other with an adhesive. Reference numeral 116 in FIG. 18 indicates an adhesive layer formed of the adhesive.

The layered substructure 115 shown in FIG. 18 and FIG. 19 includes a terminal wafer 120 disposed on the uppermost one of the substructures 110. The terminal wafer 120 has a wafer main body 121 that is plate-shaped and formed of an insulating material such as a resin or ceramic. The wafer main body 121 includes a plurality of pre-terminal-layer-body portions 21P that will be separated from each other later to thereby become the terminal layer main bodies 21. The terminal wafer 120 further includes a plurality of groups of pad-shaped terminals 22 disposed on the top surface of the wafer main body 121. One each group of pad-shaped terminals 22 is disposed in each pre-terminal-layer-body portion 21P. FIG. 18 and FIG. 19 show an example in which, at the boundaries between every two adjacent pre-terminal-layer-body portions 21P, pad-shaped terminals 22 disposed in one of the two adjacent pre-terminal-layer-body portions 21P are coupled to those disposed in the other of the two adjacent pre-terminal-layer-body portions 21P. However, it is not necessarily required that pad-shaped terminals 22 disposed in one of two adjacent pre-terminal-layer-body portions 21P be coupled to those disposed in the other of the two adjacent pre-terminal-layer-body portions 21P. The wafer main body 121 may be transparent. In this case, alignment marks may be provided on the top surface of the wafer main body 121 at the positions of the boundaries between every two adjacent pre-terminal-layer-body portions 21P.

Figure 20:
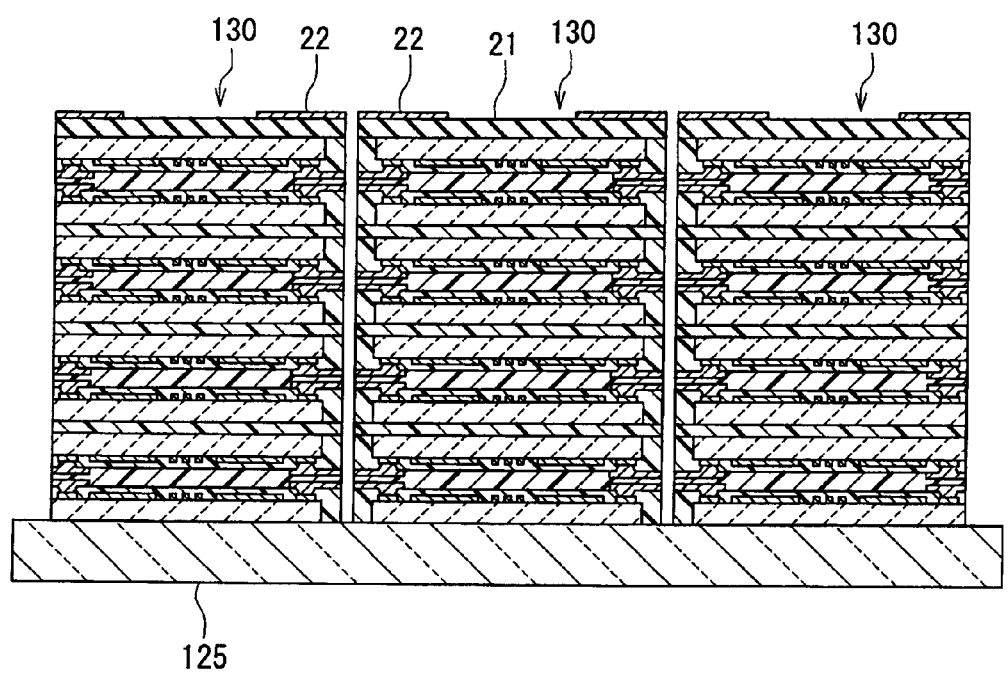
FIG. 20 is a cross-sectional view of a portion of a main body aggregate fabricated in a step that follows the step of FIG. 18.
Figure 21:
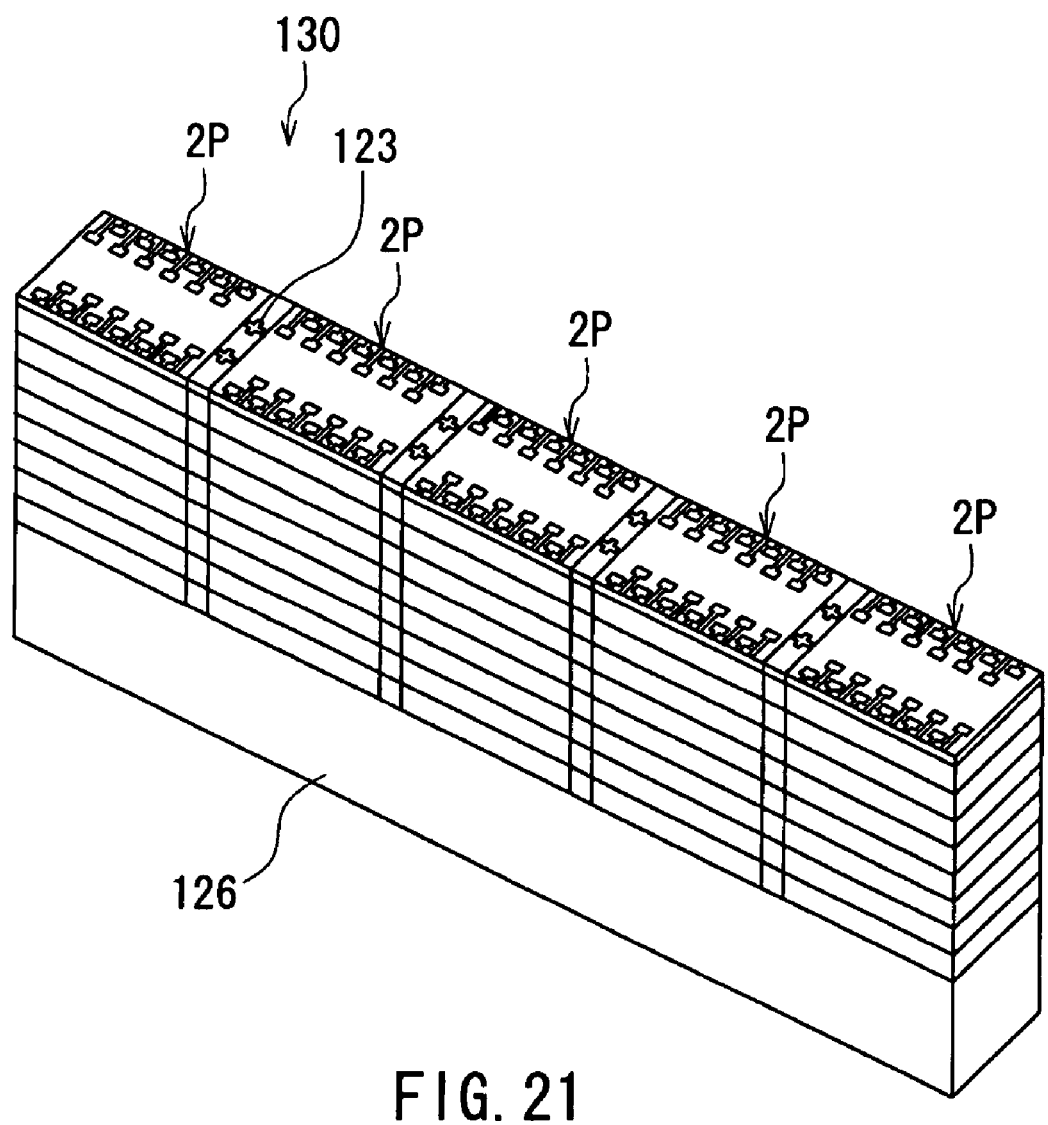
FIG. 21 is a perspective view of an example of the main body aggregate fabricated in the step of FIG. 20.
Figure 22:
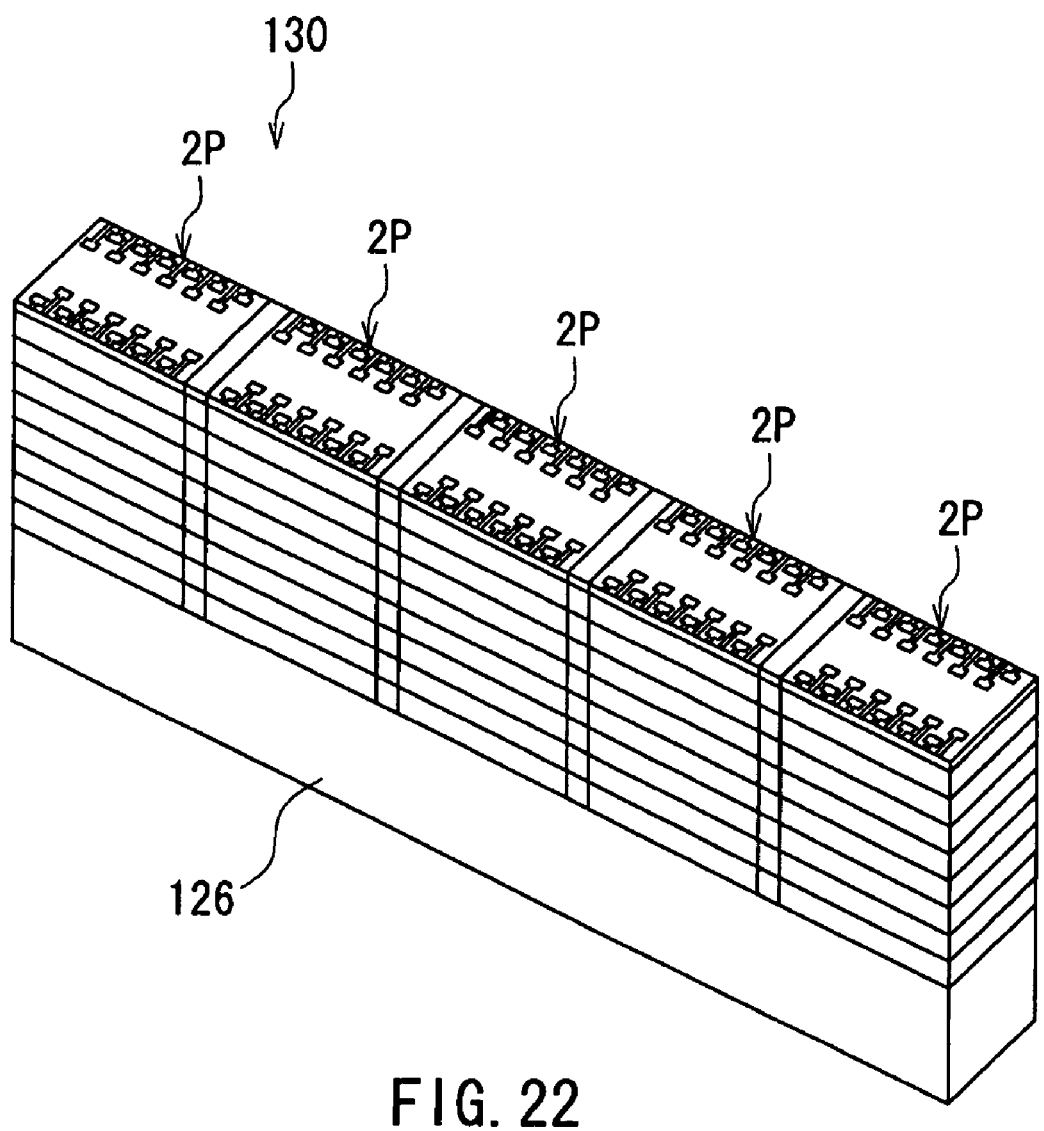
FIG. 22 is a perspective view of another example of the main body aggregate fabricated in the step of FIG. 20.

Next, as shown in FIG. 20, the layered substructure 115 is cut with a dicing saw along the first grooves 104A of FIG. 13 to provide a plurality of main body aggregates 130. FIG. 21 shows an example of each main body aggregate 130. FIG. 22 shows another example of each main body aggregate 130. As shown in FIG. 21 and FIG. 22, each main body aggregate 130 includes a plurality of pre-main-body portions 2P that are aligned in one direction that is orthogonal to the stacking direction of the plurality of layer portions 10 of the layered chip package 1. Each of the pre-main-body portions 2P will become the main body 2 later. The main body aggregate 130 shown in FIG. 21 is obtained by cutting the layered substructure 115 in which the wafer main body 121 of the terminal wafer 120 is transparent and alignment marks 123 are provided on the top surface of the wafer main body 121 at the positions of the boundaries between every adjacent two of the pre-terminal-layer-body portions 21P. The main body aggregate 130 shown in FIG. 22 is obtained by cutting the layered substructure 115 in which the alignment marks 123 are not provided on the top surface of the wafer main body 121. While FIG. 21 and FIG. 22 show that the main body aggregate 130 includes five pre-main-body portions 2P, the main body aggregate 130 can include any plural number of pre-main-body portions 2P.

The layered substructure 115 may be cut in the state of being bonded to a plate-shaped jig or to a wafer sheet that is typically used for dicing a wafer. FIG. 20 shows the example in which the layered substructure 115 has been cut in the state of being bonded to a plate-shaped jig 125. While FIG. 20 shows that the jig 125 is not cut, the jig 125 may be cut together with the layered substructure 115.

As shown in FIG. 21 and FIG. 22, the main body aggregate 130 has a top surface, a bottom surface and four side surfaces. A jig 126 may be bonded to the bottom surface of the main body aggregate 130. The jig 126 may be one obtained by cutting the jig 125 bonded to the layered substructure 115 when cutting the layered substructure 115.

Figure 23:
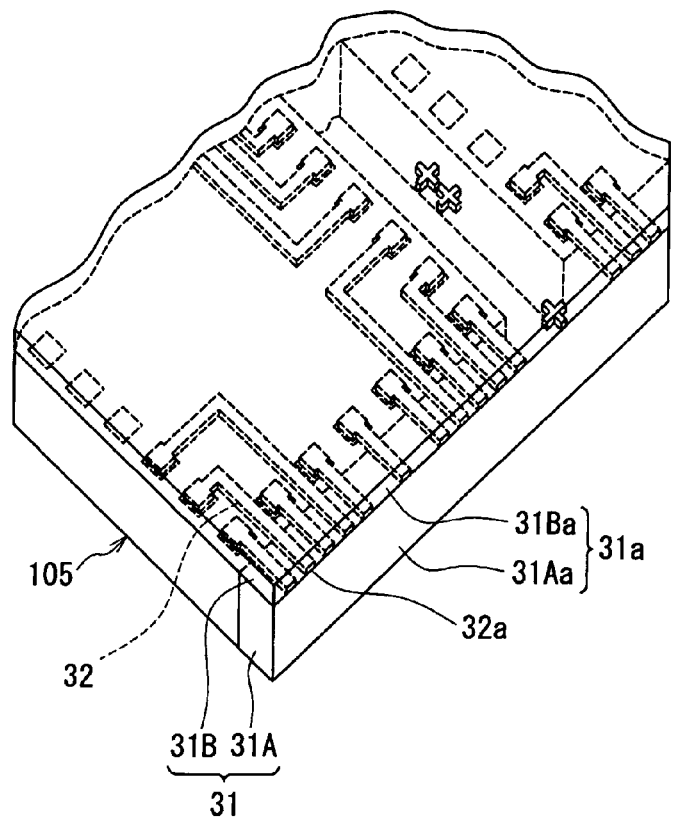
FIG. 23 is a perspective view of a portion of the main body aggregate fabricated in the step of FIG. 20.

In the step of cutting the layered substructure 115, the insulating layer 106 is cut such that a cut surface is formed along the direction in which the first groove 104A of FIG. 13 extends. FIG. 23 shows part of the main body aggregate 130 formed by cutting the layered substructure 115. As shown in FIG. 23, the insulating layer 106 becomes an insulating layer 31A by being cut. The insulating layer 31A is part of the insulating portion 31. In addition, part of the end face 31a of the insulating portion 31 is formed by the cut surface of the insulating layer 106, that is, a cut surface 31Aa of the insulating layer 31A.

In the step of cutting the layered substructure 115, the insulating layer 111 covering the electrodes 32 is also cut when the insulating layer 106 is cut. By being cut, the insulating layer 111 becomes an insulating layer 31B that is another part of the insulating portion 31. In addition, another part of the end face 31a of the insulating portion 31 is formed by the cut surface of the insulating layer 111, that is, a cut surface 31Ba of the insulating layer 31B.

In the step of cutting the layered substructure 115, by cutting the insulating layer 106, the end faces 32a of the plurality of electrodes 32 are exposed from the end face 31a of the insulating portion 31. The end faces 32a are surrounded by the insulating portion 31.

By cutting the layered substructure 115, the end faces 32a of the plurality of electrodes 32 appear at two of the four side surfaces of the main body aggregate 130, the two of the four side surfaces each being parallel to the direction in which the plurality of pre-main-body portions 2P are aligned.

To be more specific, the end faces 32Aa of the plurality of electrodes 32A of all the layer portions 10 included in the main body aggregate 130 appear at one of the above two side surfaces of the main body aggregate 130, whereas the end faces 32Ba of the plurality of electrodes 32B of all the layer portions 10 included in the main body aggregate 130 appear at the other of the two side surfaces of the main body aggregate 130 that is opposite to the one mentioned above.

In the step of completing the layered chip package 1, after cutting the layered substructure 115, polishing is performed on the two side surfaces of the main body aggregate 130 at which the end faces 32a of the electrodes 32 appear. Next, the wiring 3A, 3B is formed for each of the pre-main-body portions 2P of the main body aggregate 130. In the step of forming the wiring 3A, 3B, a plurality of main body aggregates 130 may be arranged in the stacking direction of the plurality of layer portions 10 and then the wiring 3A, 3B may be formed for each of the pre-main-body portions 2P of the plurality of main body aggregates 130 simultaneously. It is thereby possible to form the wiring 3A, 3B for a large number of pre-main-body portions 2P in a short time.

Figure 24:
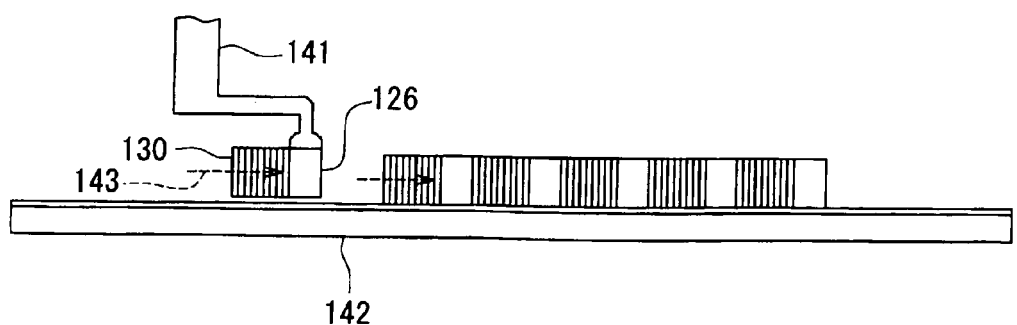
FIG. 24 is an illustrative view showing an example of a method of arranging a plurality of main body aggregates in the manufacturing method for the layered chip package of the first embodiment of the invention.
Figure 25:
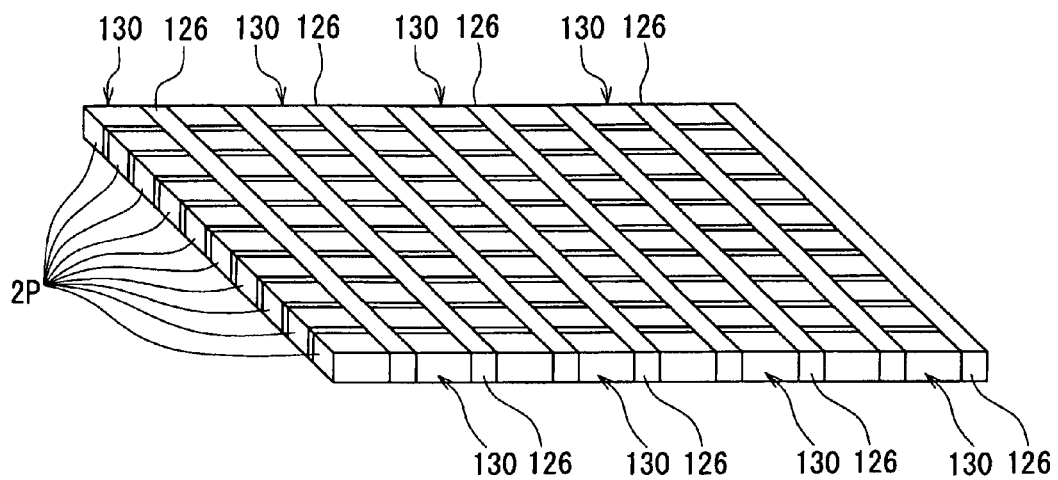
FIG. 25 is a perspective view showing a state in which a plurality of main body aggregates are arranged with a jig bonded to each of the main body aggregates.

FIG. 24 shows an example of a method of arranging a plurality of main body aggregates 130. In this example, a plurality of main body aggregates 130 each of which has the jig 126 bonded thereto are arranged on a table 142, while performing alignment, in the stacking direction of the plurality of layer portions 10 by using a chip bonding apparatus capable of recognizing and controlling the position of a chip. Reference numeral 141 in FIG. 24 indicates a head for holding a chip. In this example, a main body aggregate 130 with the jig 126 bonded thereto is held by the head 141 and placed to a desired position on the table 142 while recognizing and controlling the position of the main body aggregate 130. FIG. 25 shows a state in which a plurality of main body aggregates 130 each of which has the jig 126 bonded thereto are arranged in the stacking direction of the plurality of layer portions 10. The plurality of main body aggregates 130 thus arranged may be fixed by being bonded to each other such that they are easily separable.

When arranging the plurality of main body aggregates 130, the position of the edge of each main body aggregate 130 and/or the positions of the end faces 32a of the electrodes 32 that appear at the side surfaces of each main body aggregate 130 may be recognized with an image recognizer included in the chip bonding apparatus. It is thereby possible to recognize and control the position of each main body aggregate 130.

Figure 26:
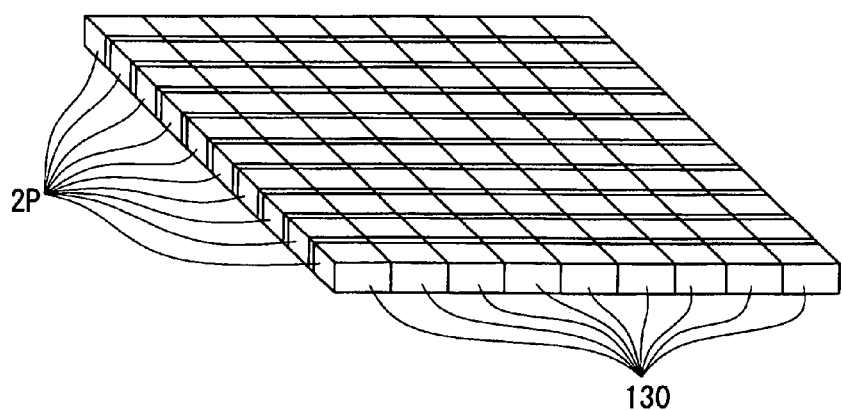
FIG. 26 is a perspective view showing a state in which a plurality of main body aggregates are arranged without any jig bonded to each of the main body aggregates.

Alternatively, a plurality of main body aggregates 130 each of which is without the jig 126 bonded thereto may be arranged in the stacking direction of the plurality of layer portions 10 while performing alignment. FIG. 26 shows the plurality of main body aggregates 130 arranged in such a manner. In this case, too, the plurality of main body aggregates 130 thus arranged may be fixed by being bonded to each other such that they are easily separable.

In the case of arranging a plurality of main body aggregates 130 each of which is without the jig 126 bonded thereto, if the portions to become the insulating portion 31 and the terminal layer main body 21 are transparent and consequently at least either the alignment marks 107 or 123 are observable, the position of each main body aggregate 130 may be recognized and controlled by recognizing at least either the alignment marks 107 or 123 through the use of the image recognizer included in the chip bonding apparatus. In this case, the alignment marks are observed in the direction of the arrow 143 in FIG. 24.

Figure 27:
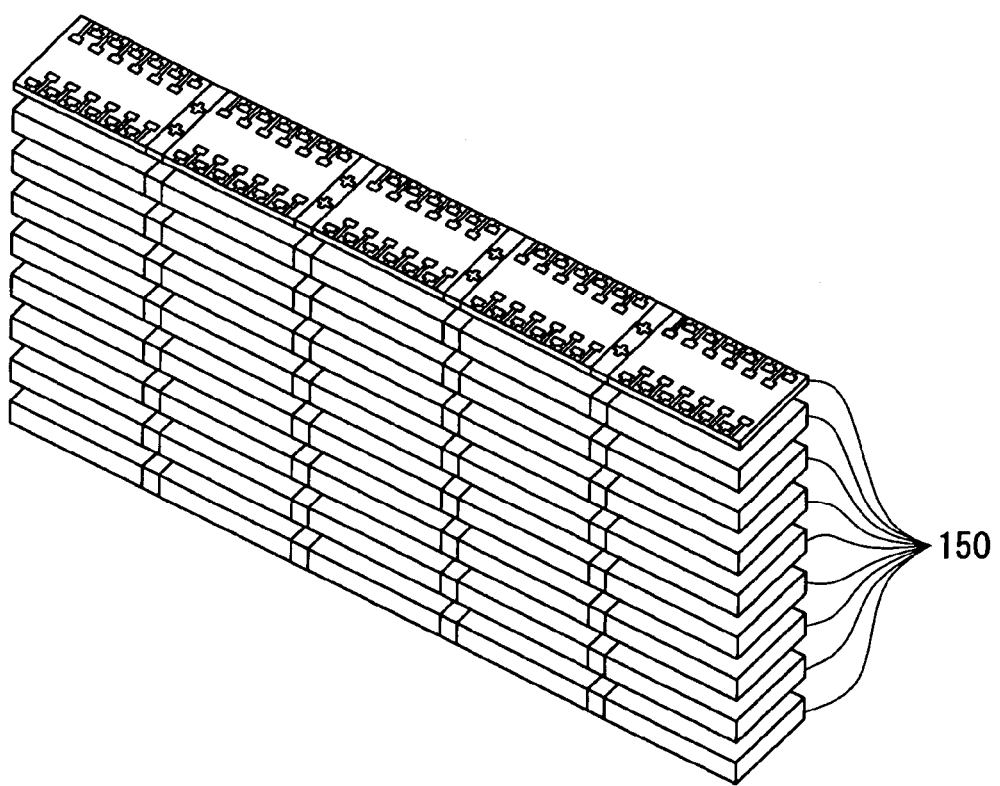
FIG. 27 is an illustrative view showing another method of forming the main body aggregate in the manufacturing method for the layered chip package of the first embodiment of the invention.

Reference is now made to FIG. 27 to describe another method of forming the main body aggregate 130. In this method, as shown in FIG. 27, a plurality of substructures 110 that respectively correspond to the plurality of layer portions 10 of the layered chip package 1 and the terminal wafer 120 are each cut to thereby form a plurality of elements 150 that will be stacked later to constitute the main body aggregate 130. Next, the plurality of elements 150 are stacked and bonded to each other with an adhesive so as to form the main body aggregate 130. According to this method, the insulating layer 106 is cut in the step of forming the plurality of elements 150, and as a result, part of the end face of the insulating portion 31 is formed by the cut surface of the insulating layer 106 and the end faces 32a of the plurality of electrodes 32 are exposed. Next, polishing is performed on the two side surfaces of the main body aggregate 130 at which the end faces 32a of the electrodes 32 appear. In this method, if the insulating layer 106 of the substructure 110 and the wafer main body 121 of the terminal wafer 120 are transparent and consequently at least either the alignment marks 107 or 123 are observable, alignment of the plurality of elements 150 to be stacked may be performed using at least either the alignment marks 107 or 123.

Figure 28:
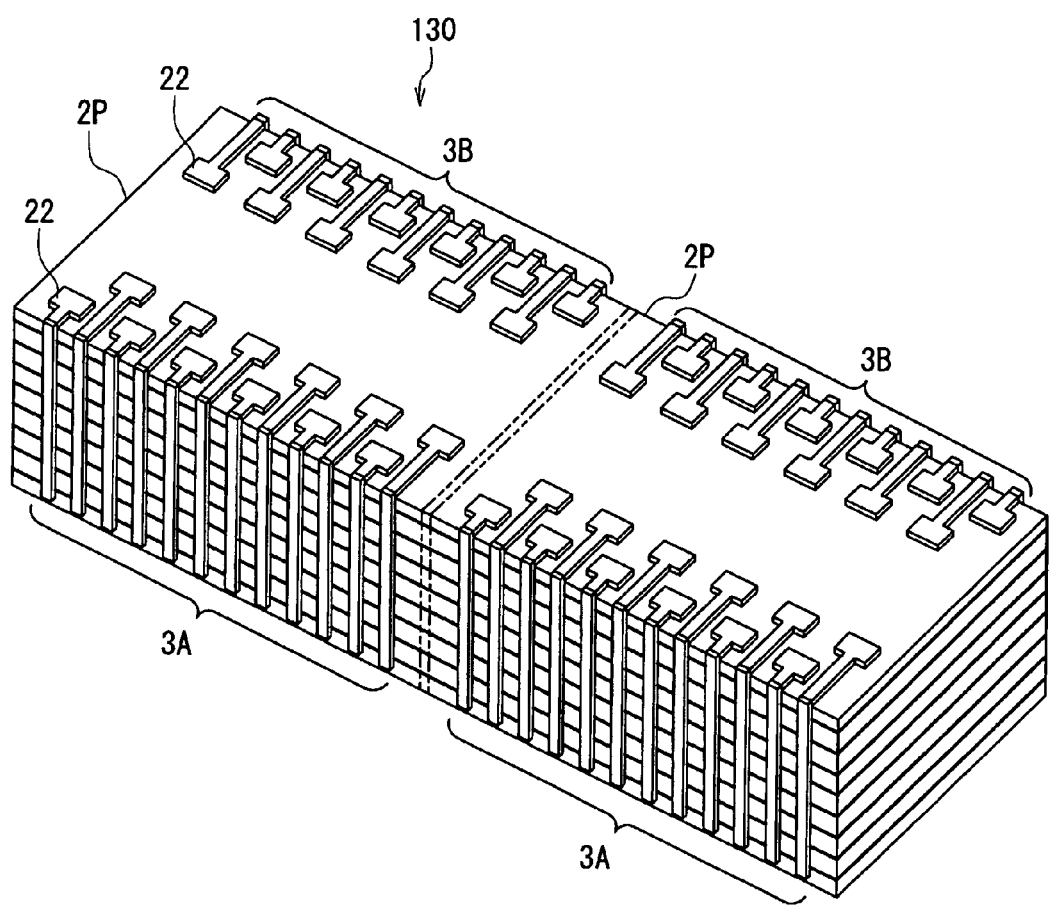
FIG. 28 is a perspective view of a portion of the main body aggregate having undergone the formation of wiring.

Reference is now made to FIG. 28 to describe the step of forming the wiring 3A, 3B. In this step, the wiring 3A, 3B is formed for each of the pre-main-body portions 2P of the main body aggregate 130. The wiring 3A, 3B is formed by frame plating, for example. In this case, first, a seed layer for plating is formed on the side surface of the main body aggregate 130 on which the wiring 3A is to be formed. Next, a frame having grooves is formed on the seed layer. The frame is formed by patterning a photoresist film by photolithography, for example. Next, plating layers to become part of the wiring 3A is formed by plating on the seed layer in the grooves of the frame. Next, the frame is removed and the seed layer except portions thereof located below the plating layers is removed by etching. As a result, the wiring 3A is formed of the plating layers and the portions of the seed layer remaining therebelow. Next, the wiring 3B is formed in the same way as the wiring 3A on the side surface of the main body aggregate 130 on which the wiring 3B is to be formed. FIG. 28 shows a portion of the main body aggregate 130 having undergone the formation of the wiring 3A, 3B.

Figure 29:
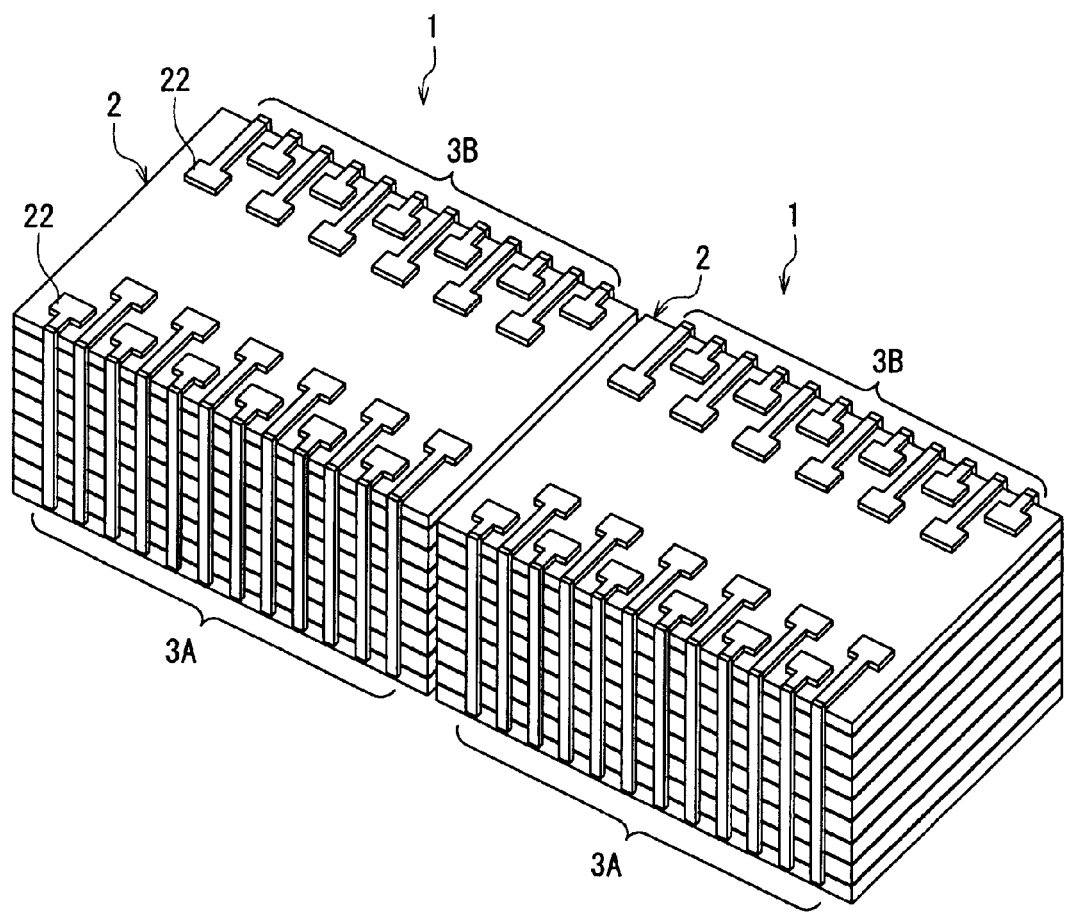
FIG. 29 is a perspective view showing a plurality of layered chip packages formed by cutting the main body aggregate.

Reference is now made to FIG. 29 to describe the step of cutting the main body aggregate 130. In this step, the main body aggregate 130 is cut to separate the plurality of pre-main-body portions 2P included in the main body aggregate 130 from each other so that each of the pre-main-body portions 2P becomes the main body 2 and a plurality of layered chip packages 1 are thereby formed. In this way, as shown in FIG. 29, a plurality of layered chip packages 1 are manufactured at the same time.

The layered chip package 1 of the present embodiment can be used as it is as a single electronic component. For example, it is possible to mount the layered chip package 1 on a wiring board by a flip-chip technique by placing the layered chip package 1 on the wiring board such that the plurality of pad-shaped terminals 22 face downward.

For example, if a device for use with the layered chip package 1 has a recessed portion to accommodate the layered chip package 1, the layered chip package 1 can be inserted to the recessed portion such that the plurality of pad-shaped terminals 22 face upward. It is thereby possible to connect the pad-shaped terminals 22 to circuits in the device.

Figure 30:
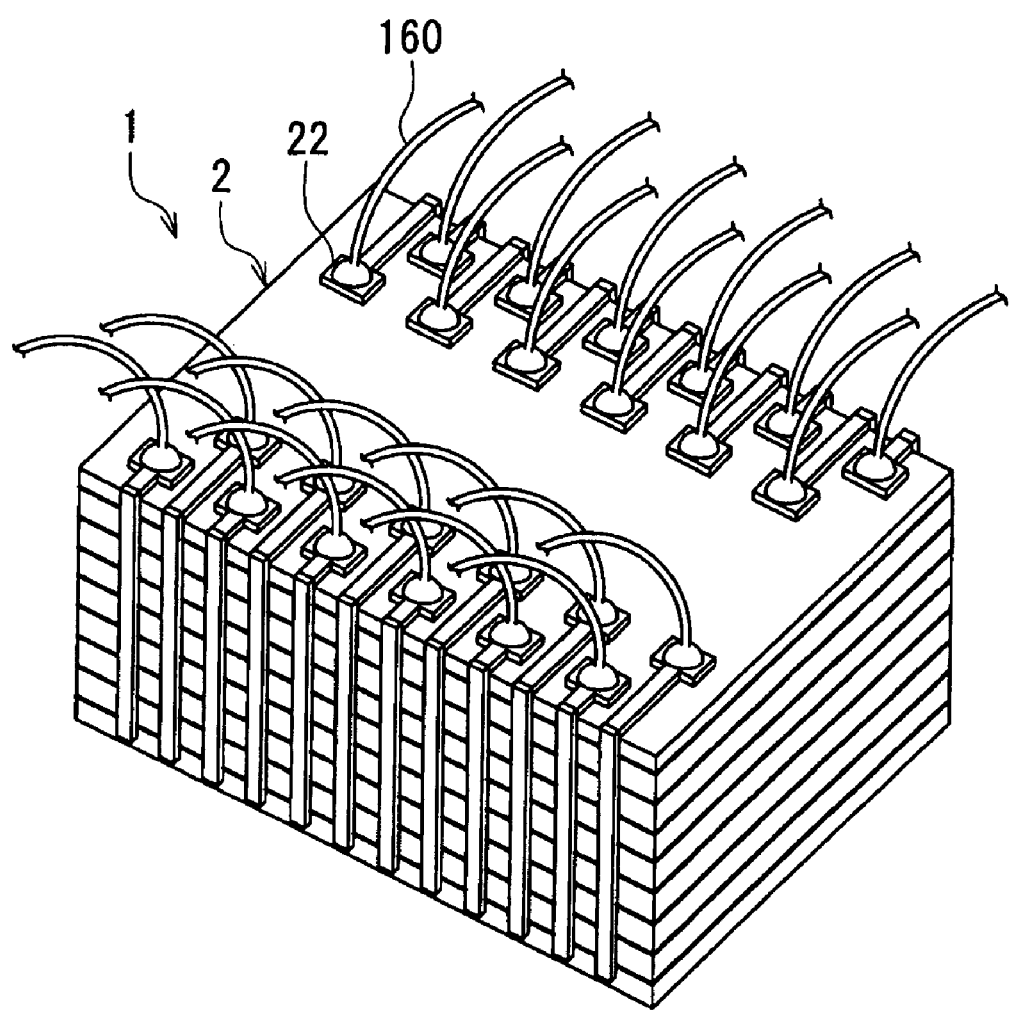
FIG. 30 is a perspective view showing an example of use of the layered chip package of the first embodiment of the invention.

FIG. 30 shows an example of use of the layered chip package 1. In this example, bonding wires 160 are connected at one end to the plurality of pad-shaped terminals 22 of the layered chip package 1. The other end of each of the bonding wires 160 is connected to a terminal of a device for use with the layered chip package 1.

Figure 31:
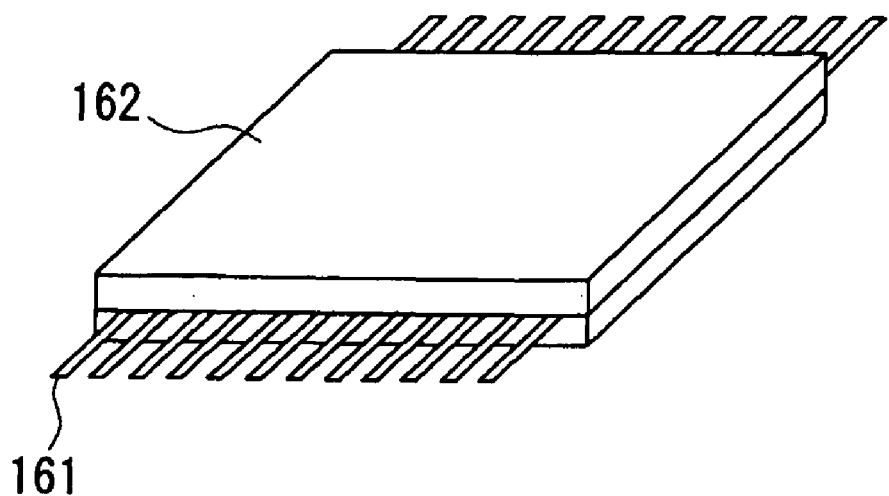
FIG. 31 is a perspective view showing another example of use of the layered chip package of the first embodiment of the invention.
Figure 32:
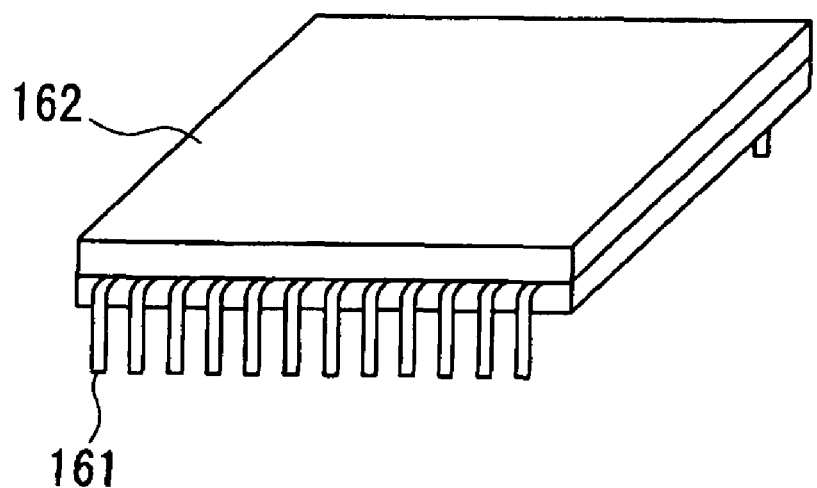
FIG. 32 is a perspective view showing still another example of use of the layered chip package of the first embodiment of the invention.

FIG. 31 and FIG. 32 show other examples of use of the layered chip package 1. In each of these examples, the layered chip package 1 is mounted to a lead frame having a plurality of pins 161 and is sealed with a molded resin. The plurality of pad-shaped terminals 22 of the layered chip package 1 are connected to the plurality of pins 161. The molded resin forms a protection layer 162 for protecting the layered chip package 1. FIG. 31 shows an example in which the plurality of pins 161 extend horizontally. FIG. 32 shows an example in which the plurality of pins 161 are folded downward.

As described so far, according to the present embodiment, it is possible to provide a layered chip package 1 that includes a plurality of chips 30 stacked and that is capable of achieving higher integration. The layered chip package 1 of the present embodiment includes a main body 2 having a top surface, a bottom surface and four side surfaces, and wiring 3 disposed on at least one of the side surfaces of the main body 2. The main body 2 includes a plurality of layer portions 10 stacked. Each of the plurality of layer portions 10 includes: a semiconductor chip 30 having a top surface, a bottom surface and four side surfaces; an insulating portion 31 covering at least one of the four side surfaces of the semiconductor chip 30; and a plurality of electrodes 32 connected to the semiconductor chip 30. The insulating portion 31 has at least one end face 31a located at the at least one of the side surfaces of the main body 2 on which the wiring 3 is disposed. Each of the plurality of electrodes 32 has an end face 32a that is surrounded by the insulating portion 31 and located at the at least one of the side surfaces of the main body 2 on which the wiring 3 is disposed. The wiring 3 is connected to the end faces 32a of the plurality of electrodes 32 of the plurality of layer portions 10.

According to the present embodiment, the plurality of semiconductor chips 30 stacked are electrically connected through the wiring 3 disposed on at least one of the side surfaces of the main body 2. Consequently, the present embodiment is free from the problems of the wire bonding method, that is, the problem that it is difficult to reduce the distance between electrodes so as to avoid contact between wires, and the problem that high resistances of the wires hamper a high-speed operation of a circuit.

Compared with the through electrode method, the present embodiment has the following advantages. First, the present embodiment does not require formation of through electrodes in each chip and consequently does not require a large number of steps for forming through electrodes in each chip.

According to the present embodiment, electrical connection between the plurality of semiconductor chips 30 is established through the wiring 3 disposed on at least one of the side surfaces of the main body 2. Consequently, the present embodiment provides higher reliability of electrical connection between chips as compared with the case of using through electrodes to establish electrical connection between chips.

Furthermore, according to the present embodiment, it is possible to easily change the line width and thickness of the wiring 3. Consequently, it is possible to respond to future demands for finer wiring 3.

The through electrode method requires that the through electrodes of upper and lower chips be connected to each other by means of, for example, soldering at high temperatures. In contrast, according to the present embodiment, it is possible to form the wiring 3 at lower temperatures because the wiring 3 can be formed by plating. According to the present embodiment, it is also possible to perform bonding of the plurality of layer portions 10 at low temperatures. Consequently, it is possible to prevent the chips 30 from suffering damage from heat.

The through electrode method further requires that upper and lower chips be accurately aligned for connecting the through electrodes of the upper and lower chips to each other. In contrast, according to the present embodiment, electrical connection between the semiconductor chips 30 is performed not at an interface between every vertically adjacent two of the layer portions 10 but through the use of the wiring 3 disposed on at least one of the side surfaces of the main body 2. Consequently, the accuracy required for alignment of the plurality of layer portions 10 is lower than that required for alignment of a plurality of chips in the through electrode method.

According to the through electrode method, the through electrodes of upper and lower chips are connected to each other by means of, for example, soldering. Consequently, if the plurality of chips stacked include one or more defective chips, it is difficult to replace the defective chip(s) with non-defective one(s). In contrast, according to the present embodiment, it is easy to replace one or more defective chips, if included in the layered chip package 1, with non-defective one(s). To replace a defective chip with a non-defective one, first, the wiring 3 is removed by means of, for example, polishing. Next, the main body 2 is disassembled to separate at least a layer portion 10 including a defective chip 30 from the other layer portions 10, and the defective chip 30 is taken out. According to the present embodiment, every vertically adjacent two of the layer portions 10 are bonded to each other with an adhesive, so that it is easy to separate them from each other. Next, the main body 2 is reconstructed with a non-defective chip 30 in place of the defective chip 30. Next, polishing is performed on the side surface(s) of the reconstructed main body 2 on which the wiring 3 is to be formed, and then the wiring 3 is formed on the polished side surface(s).

The manufacturing method for the layered chip package of the present embodiment allows a reduction in the number of steps and consequently allows a reduction in cost for the layered chip package, compared with the manufacturing method for a layered chip package disclosed in U.S. Pat. No. 5,953,588.

From the foregoing, the present embodiment makes it possible to mass-produce the layered chip package 1 at low cost in a short period of time.

[Second Embodiment]

A second embodiment of the present invention will now be described. The appearance of the layered chip package 1 of the second embodiment is as shown in FIG. 1, as in the case of the first embodiment.

Figure 33:
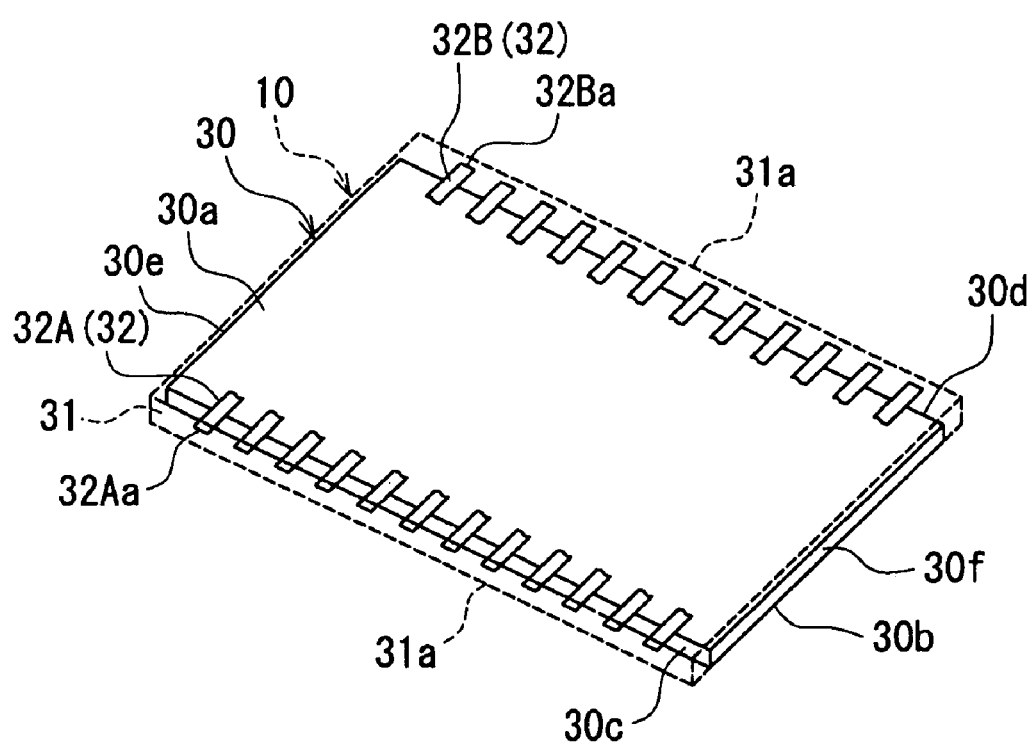
FIG. 33 is a perspective view of one of layer portions included in a layered chip package of a second embodiment of the invention.

FIG. 33 is a perspective view of a layer portion 10 of the second embodiment. According to the second embodiment, the third side surface 30e and the fourth side surface 30f of the semiconductor chip 30 are respectively located at the third side surface 2e and the fourth side surface 2f of the main body 2. The first side surface 30c and the second side surface 30d of the semiconductor chip 30 respectively face toward the first side surface 2c and the second side surface 2d of the main body. In the second embodiment, of the four side surfaces of the semiconductor chip 30, the first side surface 30c and the second side surface 30d are covered with the insulating portion 31 whereas the third side surface 30e and the fourth side surface 30f are not covered with the insulating portion 31.

Figure 34:
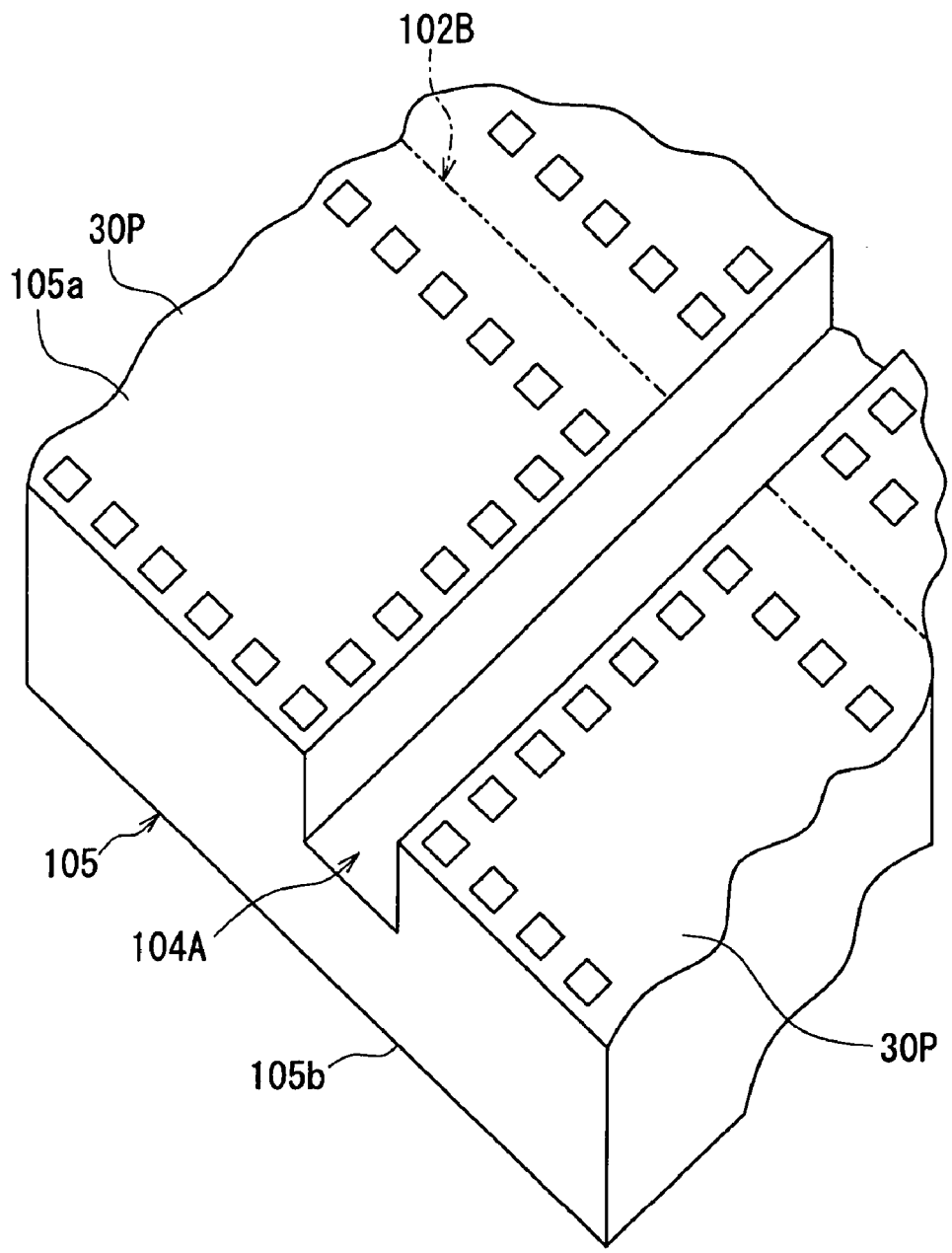
FIG. 34 is a perspective view of a portion of a substructure main body of the second embodiment of the invention.

Reference is now made to FIG. 34 to describe differences of the manufacturing method for the layered chip package 1 of the second embodiment from the method of the first embodiment. FIG. 34 shows a portion of the substructure main body 105 fabricated in the step of FIG. 4 according to the second embodiment. According to the second embodiment, in the step of FIG. 4, the plurality of first grooves 104A along the plurality of scribe lines 102A shown in FIG. 9 are only formed as the plurality of grooves 104. In other words, the plurality of second grooves 104B (see FIG. 11) along the plurality of scribe lines 102B are not formed in the second embodiment, although they are formed in the first embodiment. According to the second embodiment, in the step of FIG. 29 the main body aggregate 130 is cut along the scribe lines 102B and the pre-semiconductor-chip portions 30P are thereby separated from each other to become the semiconductor chips 30. By cutting the main body aggregate 130 along the scribe lines 102B, the third side surface 30e and the fourth side surface 30f of each semiconductor chip 30 are formed.

Compared with the first embodiment, the second embodiment allows an increase in proportion of the area occupied by the semiconductor chip 30 in each layer portion 10, and consequently allows the layered chip package 1 to achieve a higher level of integration. The remainder of configuration, function and effects of the second embodiment are similar to those of the first embodiment.

[Third Embodiment]

A third embodiment of the present invention will now be described. FIG. 35 is a perspective view of the layered chip package 1 of the third embodiment. As shown in FIG. 35, the layered chip package 1 of the third embodiment has, as the wiring 3 disposed on at least one of the side surfaces of the main body 2, only the wiring 3A disposed on the first side surface 2c of the main body 2. The wiring 3B (see FIG. 1) disposed on the second side surface 2d of the main body 2 in the first and second embodiments is not provided in the third embodiment. Furthermore, in the third embodiment, all of the plurality of pad-shaped terminals 22 included in the terminal layer 20 each have an end face located at the side surface 2c of the main body 2. The wiring 3A is connected to the end face of each of the pad-shaped terminals 22.

FIG. 36 is a perspective view of a layer portion 10 of the third embodiment. In the third embodiment, as shown in FIG. 36, the second side surface 30d, the third side surface 30e and the fourth side surface 30f of the semiconductor chip 30 are respectively located at the second side surface 2d, the third side surface 2e and the fourth side surface 2f of the main body 2. The first side surface 30c of the semiconductor chip 30 faces toward the first side surface 2c of the main body. In the third embodiment, of the four side surfaces of the semiconductor chip 30, the first side surface 30c is covered with the insulating portion 31 whereas the second side surface 30d, the third side surface 30e and the fourth side surface 30f are not covered with the insulating portion 31.

In the third embodiment, each layer portion 10 includes only the plurality of first electrodes 32A as the plurality of electrodes 32 connected to the semiconductor chip 30. Each of the plurality of electrodes 32A has an end face 32Aa located at the first side surface 2c of the main body 2 and surrounded by the insulating portion 31. The wiring 3A disposed on the first side surface 2c of the main body 2 is connected to the end faces 32Aa of the plurality of electrodes 32A of the plurality of layer portions 10.

Figure 37:
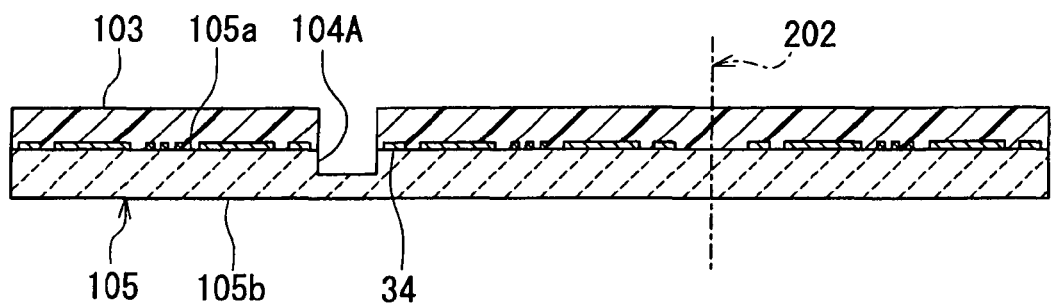
FIG. 37 is a cross-sectional view of a portion of a substructure main body of the third embodiment of the invention.

Reference is now made to FIG. 37 to describe differences of the manufacturing method for the layered chip package 1 of the third embodiment from the method of the first embodiment. FIG. 37 shows a portion of the substructure main body 105 of the third embodiment. According to the third embodiment, after the pre-substructure wafer 101 is fabricated in the step of FIG. 3, a protection film 103 made of photoresist or the like is formed to cover the entire first surface 101a of the pre-substructure wafer 101. Next, a plurality of grooves 104 that open at the first surface 101a of the pre-substructure wafer 101 and extend to be adjacent to at least one of the pre-semiconductor-chip portions 30P are formed in the pre-substructure wafer 101. As a result, the substructure main body 105 is formed by the pre-substructure wafer 101 having undergone the formation of the plurality of grooves 104 therein.

In the third embodiment, only a plurality of first grooves 104A along every other scribe line 102A of the plurality of scribe lines 102A shown in FIG. 9 are formed as the plurality of grooves 104. Consequently, according to the third embodiment, no groove is formed between two pre-semiconductor-chip portions 30P located between adjacent two of the grooves 104A. In FIG. 37 the alternate long and short dashed line 202 indicates the boundary between two pre-semiconductor-chip portions 30P located between adjacent two of the grooves 104A.

According to the third embodiment, in the step of forming a plurality of main body aggregates 130 (see FIG. 20) by cutting the layered substructure 115, the layered substructure 115 is cut along each of the plurality of scribe lines 102A. At the positions of scribe lines 102A with the grooves 104A formed therealong, as shown in FIG. 23, the insulating layer 106 formed in the grooves 104A is cut to form the insulating layer 31A, and the insulating layer 111 covering the electrodes 32 is cut to form the insulating layer 31B. The cut surface 31Aa of the insulating layer 31A and the cut surface 31Ba of the insulating layer 31B constitute the end face 31a of the insulating portion 31.

At the positions of scribe lines 102A without the grooves 104A formed therealong, i.e., at the positions indicated by the alternate long and short dashed line 202 of FIG. 37, the second side surface 30d of each semiconductor chip 30 is formed by cutting the layered substructure 115 along the scribe lines 102A in the step of forming a plurality of main body aggregates 130 (see FIG. 20).

In the third embodiment, as in the second embodiment, the plurality of second grooves 104B (see FIG. 11) along the scribe lines 102B are not formed. According to the third embodiment, in the step of FIG. 29 the main body aggregate 130 is cut along the scribe lines 102B and the pre-semiconductor-chip portions 30P are thereby separated from each other to become the semiconductor chips 30. By cutting the main body aggregate 130 along the scribe lines 102B, the third side surface 30e and the fourth side surface 30f of each semiconductor chip 30 are also formed.

Compared with the first and second embodiments, the third embodiment allows an increase in proportion of the area occupied by the semiconductor chip 30 in each layer portion 10, and consequently allows the layered chip package 1 to achieve a higher level of integration. The remainder of configuration, function and effects of the third embodiment are similar to those of the first embodiment.

The present invention is not limited to the foregoing embodiments but can be carried out in various modifications. For example, while in the foregoing embodiments a plurality of main body aggregates 130 are arranged and then the wiring 3 is formed for the pre-main-body portions 2P of the plurality of main body aggregates 130 at the same time, the wiring 3 may be formed for the pre-main-body portions 2P of a single main body aggregate 130 without arranging a plurality of main body aggregates 130.

In addition, after the main body 2 is formed by cutting the main body aggregate 130 having undergone the formation of the wiring 3, another wiring may be formed on a surface formed for the main body 2 as a result of cutting the main body aggregate 130.

In addition, the terminal layer 20 may be eliminated from the main body 2 of the layered chip package 1 and part of the wiring 3 may also function as external connecting terminals.

It is apparent that the present invention can be carried out in various forms and modifications in the light of the foregoing descriptions. Accordingly, within the scope of the following claims and equivalents thereof, the present invention can be carried out in forms other than the foregoing most preferred embodiments.

What is claimed is:

1. A layered chip package comprising:
a main body having a top surface, a bottom surface, first and second side surfaces facing toward opposite directions, and third and fourth side surfaces facing toward opposite directions; and
a wiring disposed on the first side surface of the main body, wherein:
the main body includes a plurality of layer portions stacked;
each of the plurality of layer portions includes a semiconductor chip having a top surface, a bottom surface, first and second side surfaces facing toward opposite directions, and third and fourth side surfaces facing toward opposite directions;
the second, third and fourth side surfaces of the semiconductor chip are respectively located at the second, third and fourth side surfaces of the main body;
the first side surface of the semiconductor chip faces toward the first side surface of the main body;
each of the plurality of layer portions further includes: an insulating portion covering the first side surface of the semiconductor chip; and a plurality of electrodes connected to the semiconductor chip;
the insulating portion has an end face located at the first side surface of the main body;
each of the plurality of electrodes has an end face located at the first side surface of the main body and surrounded by the insulating portion;
the wiring is connected to the end faces of the plurality of electrodes of the plurality of layer portions; and
an entirety of the first side surface of the main body on which the wiring is disposed is flat without the wiring.

2. A layered chip package comprising:
a main body having a top surface, a bottom surface, first and second side surfaces facing toward opposite directions, and third and fourth side surfaces facing toward opposite directions;
a first wiring disposed on the first side surface of the main body; and
a second wiring disposed on the second side surface of the main body, wherein:
the main body includes a plurality of layer portions stacked;
each of the plurality of layer portions includes a semiconductor chip having a top surface, a bottom surface, first and second side surfaces facing toward opposite directions, and third and fourth side surfaces facing toward opposite directions;
the third and fourth side surfaces of the semiconductor chip are respectively located at the third and fourth side surfaces of the main body;
the first and second side surfaces of the semiconductor chip respectively face toward the first and second side surfaces of the main body;
each of the plurality of layer portions further includes: an insulating portion covering the first and second side surfaces of the semiconductor chip; and a plurality of first electrodes and a plurality of second electrodes connected to the semiconductor chip;
the insulating portion has a first end face located at the first side surface of the main body, and a second end face located at the second side surface of the main body;
each of the plurality of first electrodes has an end face located at the first side surface of the main body and surrounded by the insulating portion;
each of the plurality of second electrodes has an end face located at the second side surface of the main body and surrounded by the insulating portion;
the first wiring is connected to the end faces of the plurality of first electrodes of the plurality of layer portions;
the second wiring is connected to the end faces of the plurality of second electrodes of the plurality of layer portions; and
an entirety of the first side surface of the main body on which the first wiring is disposed and an entirety of the second side surface of the main body on which the second wiring is disposed are flat without the first and second wiring.

3. A layered chip package substructure for use for manufacturing a layered chip package, the layered chip package comprising:
a main body having a top surface, a bottom surface and four side surfaces; and
a wiring disposed on at least one of the side surfaces of the main body, wherein:
the main body includes a plurality of layer portions stacked;
each of the plurality of layer portions includes:
a semiconductor chip having a top surface,
a bottom surface and four side surfaces,
an insulating portion covering at least one of the four side surfaces of the semiconductor chip, and
a plurality of electrodes connected to the semiconductor chip;
the insulating portion has at least one end face located at the at least one of the side surfaces of the main body on which the wiring is disposed;

each of the plurality of electrodes has an end face that is surrounded by the insulating portion and located at the at least one of the side surfaces of the main body on which the wiring is disposed; and the wiring is connected to the end faces of the plurality of electrodes of the plurality of layer portions, an entirety of the at least one side surface of the main body on which the wiring is disposed being flat without the wiring, the layered chip package substructure corresponding to one of the plurality of layer portions of the layered chip package, including a plurality of its corresponding layer portions, and being intended to be cut later at a boundary between every adjacent ones of the plurality of its corresponding layer portions, the layered chip package substructure comprising a substructure main body fabricated by performing processing on a first surface of a semiconductor wafer having the first surface and a second surface that face toward opposite directions, the substructure main body including a plurality of pre-semiconductor-chip portions aligned, each of the pre-semiconductor-chip portions including a device, wherein:

the substructure main body has a first surface and a second surface that respectively correspond to the first surface and the second surface of the semiconductor wafer, and has at least one groove that opens at the first surface of the substructure main body and that extends to be adjacent to at least one of the pre-semiconductor-chip portions; and the at least one groove has a bottom that does not reach the second surface of the substructure main body, the layered chip package substructure further comprising:
an insulating layer that fills the at least one groove and that will later become part of the insulating portion; and the plurality of electrodes each having a portion lying on the insulating layer.

* * * * *